(12) United States Patent
Kim

(10) Patent No.: US 12,431,463 B2
(45) Date of Patent: Sep. 30, 2025

(54) PRINTED CIRCUIT BOARD AND SEMICONDUCTOR PACKAGE WHICH INCLUDE MULTI-LAYERED PHOTOSENSITIVE INSULATING LAYER

(71) Applicant: Samsung Electronics Co., Ltd., Suwon-si (KR)

(72) Inventor: Hyejin Kim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 681 days.

(21) Appl. No.: 17/737,086

(22) Filed: May 5, 2022

(65) Prior Publication Data

US 2023/0042852 A1 Feb. 9, 2023

(30) Foreign Application Priority Data

Aug. 3, 2021 (KR) .......................... 10-2021-0101964

(51) Int. Cl.
*H01L 25/065* (2023.01)
*H01L 21/48* (2006.01)
(Continued)

(52) U.S. Cl.
CPC ...... *H01L 25/0652* (2013.01); *H01L 21/4857* (2013.01); *H01L 21/486* (2013.01); *H01L 23/49816* (2013.01); *H01L 23/49822* (2013.01); *H01L 23/49838* (2013.01); *H01L 24/16* (2013.01); *H01L 24/32* (2013.01); *H05K 1/113* (2013.01); *H05K 3/108* (2013.01); *H01L 24/73* (2013.01); *H01L 25/162* (2013.01); *H01L 2224/16227* (2013.01); *H01L 2224/16238* (2013.01); *H01L 2224/32145* (2013.01); *H01L 2224/32225* (2013.01);
(Continued)

(58) Field of Classification Search
CPC ........... H01L 21/4857; H01L 23/49822; H01L 21/486; H05K 1/113
USPC ................................................ 257/686, 690
See application file for complete search history.

(56) References Cited

U.S. PATENT DOCUMENTS

| 7,288,364 B2 | 10/2007 | Jung et al. |
| 10,444,572 B2 | 10/2019 | Cao |

(Continued)

FOREIGN PATENT DOCUMENTS

| JP | 2017-224819 A | 12/2017 |
| KR | 10-0642416 B1 | 11/2006 |

(Continued)

*Primary Examiner* — Eliseo Ramos Feliciano
*Assistant Examiner* — Mikka Liu
(74) *Attorney, Agent, or Firm* — Wolf, Greenfield & Sacks, P.C.

(57) ABSTRACT

A printed circuit board may include a substrate body portion, conductive patterns on a top surface of the substrate body portion, and a photosensitive insulating layer on the top surface of the substrate body portion and including an opening exposing at least one of the conductive patterns. The photosensitive insulating layer includes first to third sub-layers stacked sequentially. The first sub-layer includes an amine compound or an amide compound. A refractive index of the second sub-layer is lower than a refractive index of the third sub-layer. A photosensitizer content of the second sub-layer is higher than a photosensitizer content of the third sub-layer.

20 Claims, 24 Drawing Sheets

(51) Int. Cl.
*H01L 23/00* (2006.01)
*H01L 23/498* (2006.01)
*H05K 1/11* (2006.01)
*H05K 3/10* (2006.01)
*H01L 25/16* (2023.01)

(52) U.S. Cl.
CPC ............ *H01L 2224/73204* (2013.01); *H01L 2924/1431* (2013.01); *H01L 2924/1434* (2013.01); *H05K 2201/0166* (2013.01); *H05K 2201/0195* (2013.01); *H05K 2201/09563* (2013.01)

(56) References Cited

U.S. PATENT DOCUMENTS

| | | | |
|---|---|---|---|
| 2006/0012967 | A1* | 1/2006 | Asai .................... H05K 1/0274 361/764 |
| 2010/0101843 | A1* | 4/2010 | Wakabayashi ....... H05K 3/4652 428/458 |
| 2019/0326222 | A1 | 10/2019 | Chavali et al. |
| 2022/0091505 | A1* | 3/2022 | Liao .................. H01L 23/49894 |

FOREIGN PATENT DOCUMENTS

| | | |
|---|---|---|
| KR | 10-0733705 B1 | 6/2007 |
| KR | 10-0796501 B1 | 1/2008 |
| KR | 10-0824619 B1 | 4/2008 |
| KR | 10-2012-0080887 A | 7/2012 |

\* cited by examiner

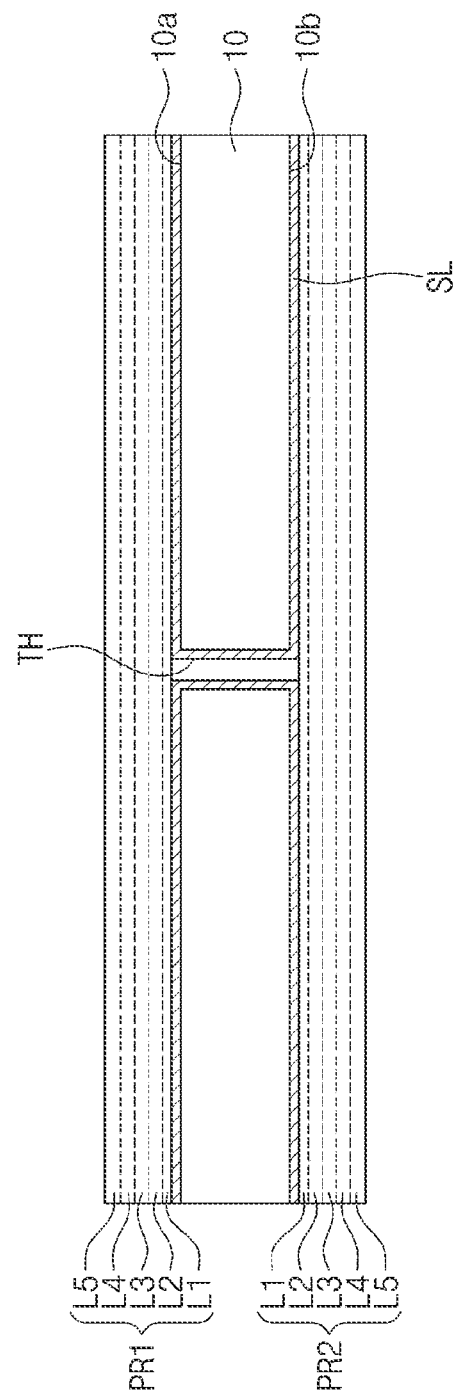

PRINTED CIRCUIT BOARD AND SEMICONDUCTOR PACKAGE WHICH INCLUDE MULTI-LAYERED PHOTOSENSITIVE INSULATING LAYER

CROSS-REFERENCE TO RELATED APPLICATION

This U.S. non-provisional patent application claims priority under 35 U.S.C. § 119 to Korean Patent Application No. 10-2021-0101964, filed on Aug. 3, 2021, in the Korean Intellectual Property Office, the entire contents of which are hereby incorporated by reference.

FIELD

The present disclosure relates to a semiconductor package and a method of manufacturing the same, and more particularly, to a printed circuit board and a semiconductor package which include multi-layered photosensitive insulating layers, and methods of manufacturing the same.

BACKGROUND

A printed circuit board may be used as a package substrate of a semiconductor package, or a board substrate on which semiconductor packages are mounted. High-performance, high-speed and small electronic components have been increasingly demanded with the development of the electronics industry. To satisfy these demands, sizes or widths of conductive patterns formed in the printed circuit board have been reduced. In addition, techniques of highly integrating a semiconductor device and a semiconductor package have been variously studied.

SUMMARY

Embodiments of the present inventive concepts may provide a highly integrated printed circuit board with improved reliability.

Embodiments of the present inventive concepts may also provide a highly integrated semiconductor package with improved reliability.

Embodiments of the present inventive concepts may further provide a method of manufacturing a printed circuit board, which is capable of realizing precise patterning.

Embodiments of the present inventive concepts may further provide a method of manufacturing a semiconductor package, which is capable of realizing precise patterning.

According to some embodiments of the present inventive concepts, a printed circuit board may include a substrate body portion, conductive patterns on a top surface of the substrate body portion, and a photosensitive insulating layer on (e.g., covering) the top surface of the substrate body portion and including an opening exposing at least one of the conductive patterns. The photosensitive insulating layer may include a first sub-layer, a second sub-layer and a third sub-layer which are stacked sequentially. The first sub-layer may include an amine compound or an amide compound. A refractive index of the second sub-layer may be lower than a refractive index of the third sub-layer. A photosensitizer content of the second sub-layer may be higher than a photosensitizer content of the third sub-layer.

According to some embodiments of the present inventive concepts, a semiconductor package may include a first redistribution substrate, a semiconductor device on the first redistribution substrate, a mold layer on (e.g., covering) the semiconductor device and the first redistribution substrate, a second redistribution substrate on the mold layer, a signal via in (e.g. penetrating) the mold layer to connect the first redistribution substrate and the second redistribution substrate, the signal via being configured to transmit an electrical signal, a power via connecting the first redistribution substrate and the second redistribution substrate, the power via being configured to transmit a power voltage, and connection terminals contacting (e.g., bonded to) a bottom surface of the first redistribution substrate. The first redistribution substrate may include a first photosensitive insulating layer and a second photosensitive insulating layer which are stacked sequentially. The first photosensitive insulating layer may include a first sub-layer, a second sub-layer and a third sub-layer which are stacked sequentially. The first sub-layer may include an amine compound or an amide compound. A refractive index of the second sub-layer may be lower than a refractive index of the third sub-layer. A photosensitizer content of the second sub-layer may be higher than a photosensitizer content of the third sub-layer.

According to some embodiments of the present inventive concepts, a semiconductor package may include a substrate; and a semiconductor device mounted on the substrate. The substrate may include a substrate body portion, conductive patterns on a top surface of the substrate body portion, and a photosensitive insulating layer on (e.g., covering) the top surface of the substrate body portion and including an opening exposing at least one of the conductive patterns. The photosensitive insulating layer may include a first sub-layer, a second sub-layer, a third sub-layer and a fourth sub-layer which are stacked sequentially. The first sub-layer may include an amine compound or an amide compound. A refractive index of the second sub-layer may be lower than refractive indexes of the third and fourth sub-layers. A photosensitizer content of the third sub-layer may be higher than a photosensitizer content of the fourth sub-layer.

According to some embodiments of the present inventive concepts, a method of manufacturing a printed circuit board may include forming a seed layer on a substrate body portion, forming a photosensitive mask layer on the seed layer, performing exposure and development processes on the photosensitive mask layer to form photosensitive mask patterns and to expose a top surface of the seed layer (e.g., a first portion of the seed layer) between the photosensitive mask patterns, performing a plating process to form a conductive pattern between the photosensitive mask patterns, and removing the photosensitive mask patterns and the seed layer (e.g., second portions of the seed layer) under the photosensitive mask patterns to expose the substrate body portion. The forming of the photosensitive mask layer on the seed layer may include sequentially forming a first sub-layer, a second sub-layer and a third sub-layer on a sacrificial substrate, and removing the sacrificial substrate. The first sub-layer may include an amine compound or an amide compound. A refractive index of the second sub-layer may be lower than a refractive index of the third sub-layer. A photosensitizer content of the second sub-layer may be higher than a photosensitizer content of the third sub-layer.

According to some embodiments of the present inventive concepts, a method of manufacturing a semiconductor package may include forming on a sacrificial substrate a first sub-layer including an amine compound or an amide compound, sequentially forming (e.g., stacking) a second sub-layer and a third sub-layer on the first sub-layer, wherein a refractive index of the second sub-layer is lower than a refractive index of the third sub-layer; a photosensitizer content of the second sub-layer is higher than a photosensitizer content of the third sub-layer; and the first to third sub-layers constitute a first photosensitive insulating layer, performing exposure and development processes on the first photosensitive insulating layer to form a first via hole, conformally forming a barrier/seed layer on the first photosensitive insulating layer including the first via hole, forming on the first photosensitive insulating layer a mask pattern including an opening which exposes the barrier/seed layer and overlaps with the first via hole, and performing a plating process to form a redistribution pattern in (e.g., filling) the first via hole and the opening.

BRIEF DESCRIPTION OF THE DRAWINGS

FIGS. 1A to 1H are cross-sectional views illustrating a method of manufacturing a printed circuit board according to some embodiments of the inventive concepts.

DETAILED DESCRIPTION

Example embodiments of the inventive concepts will now be described more fully with reference to the accompanying drawings. In the present specification, a photosensitive insulating layer and a photosensitive mask layer may be referred to as a photosensitive resist (or photoresist) or a photosensitive resist layer (or photoresist layer).

FIGS. 1A to 1H are cross-sectional views illustrating a method of manufacturing a printed circuit board according to some embodiments of the inventive concepts.

Figure 1A:
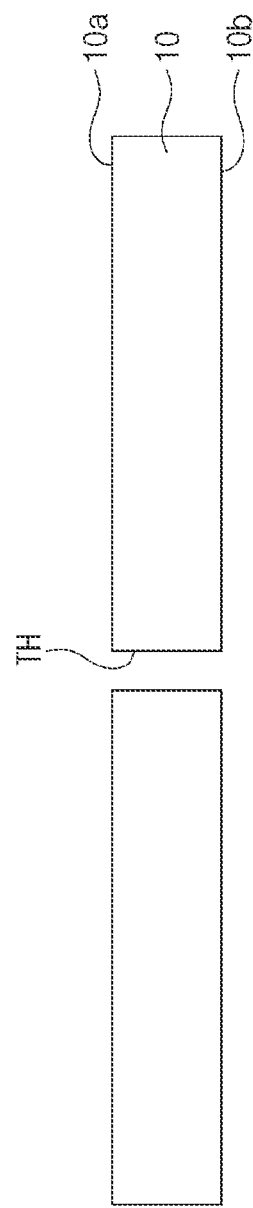
Figure 1B:
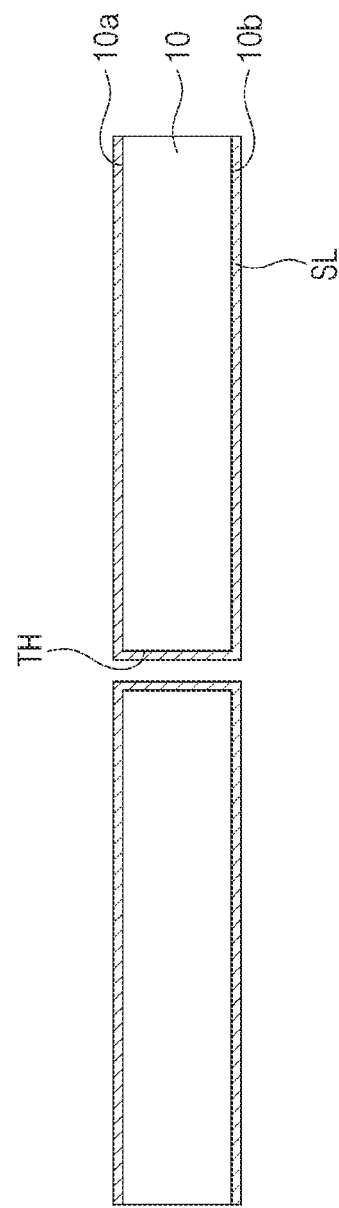
Figure 1D:
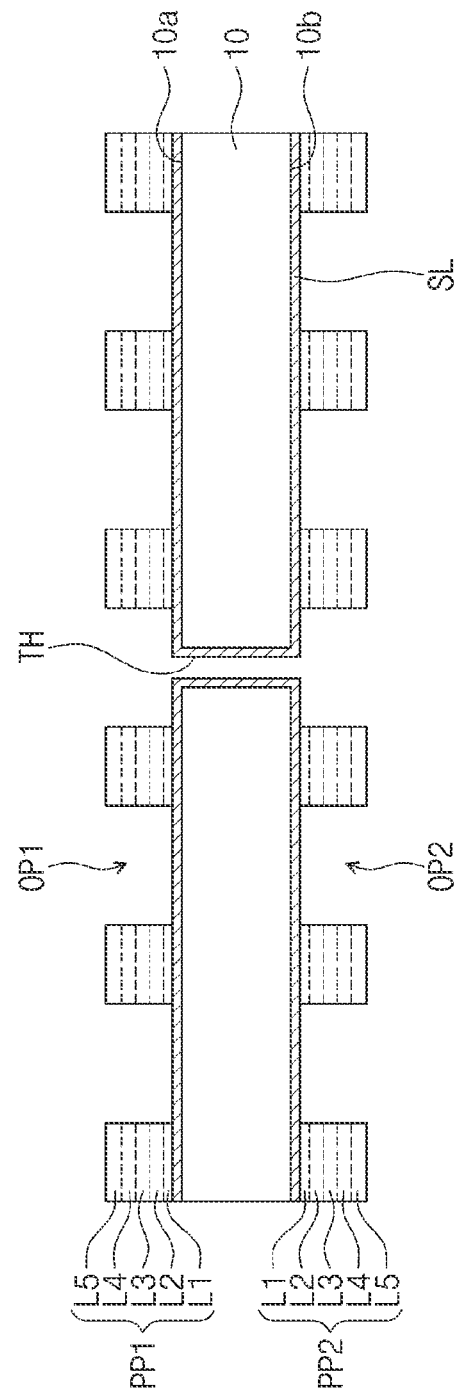
Figure 1E:
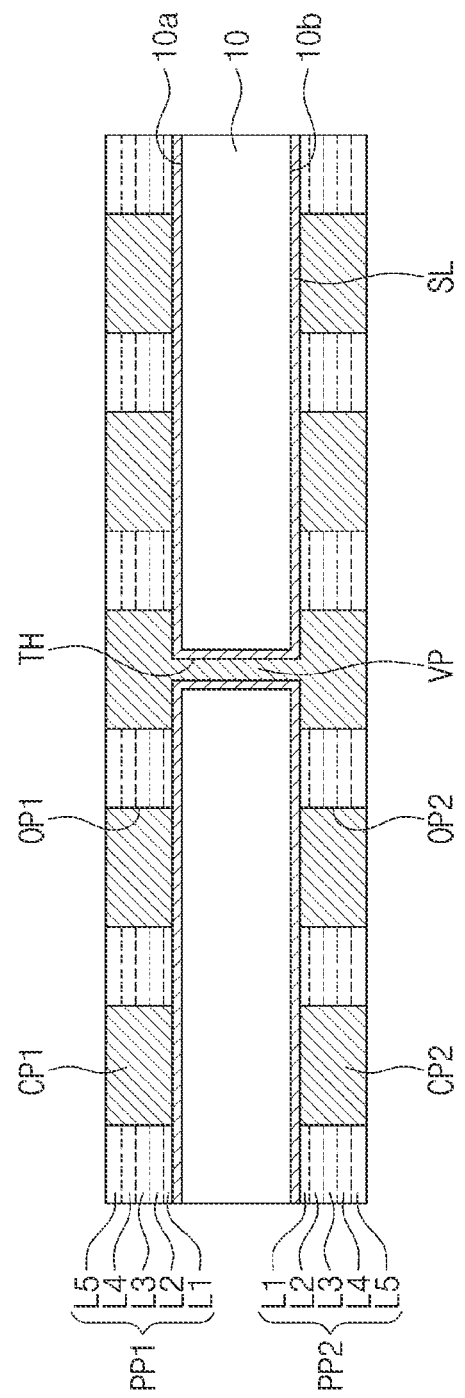
Figure 1F:
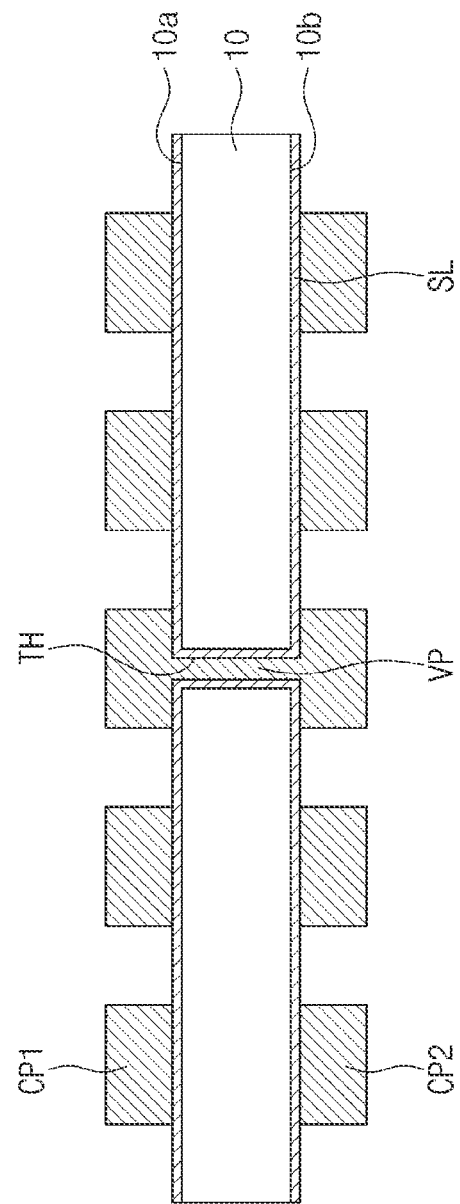
Figure 1G:
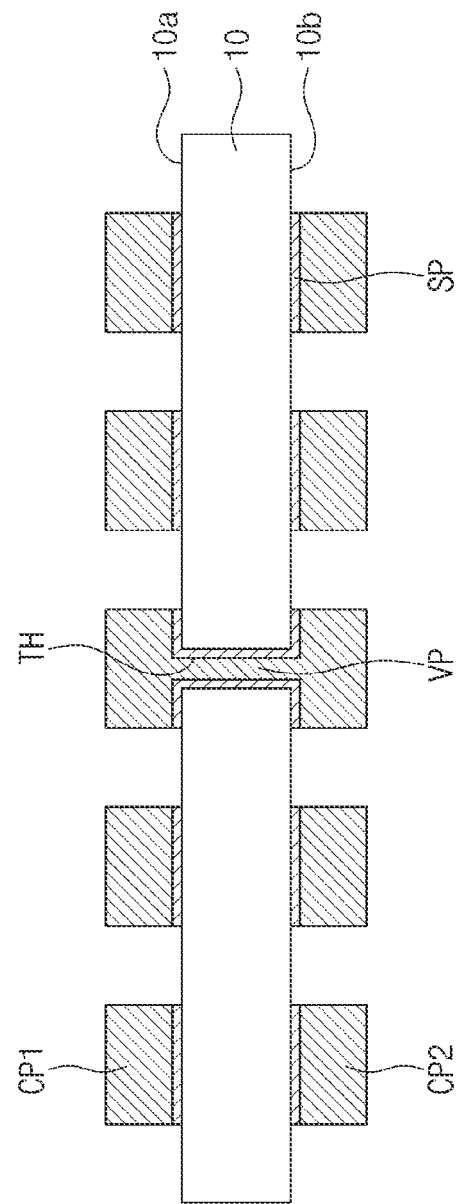
Figure 1H:
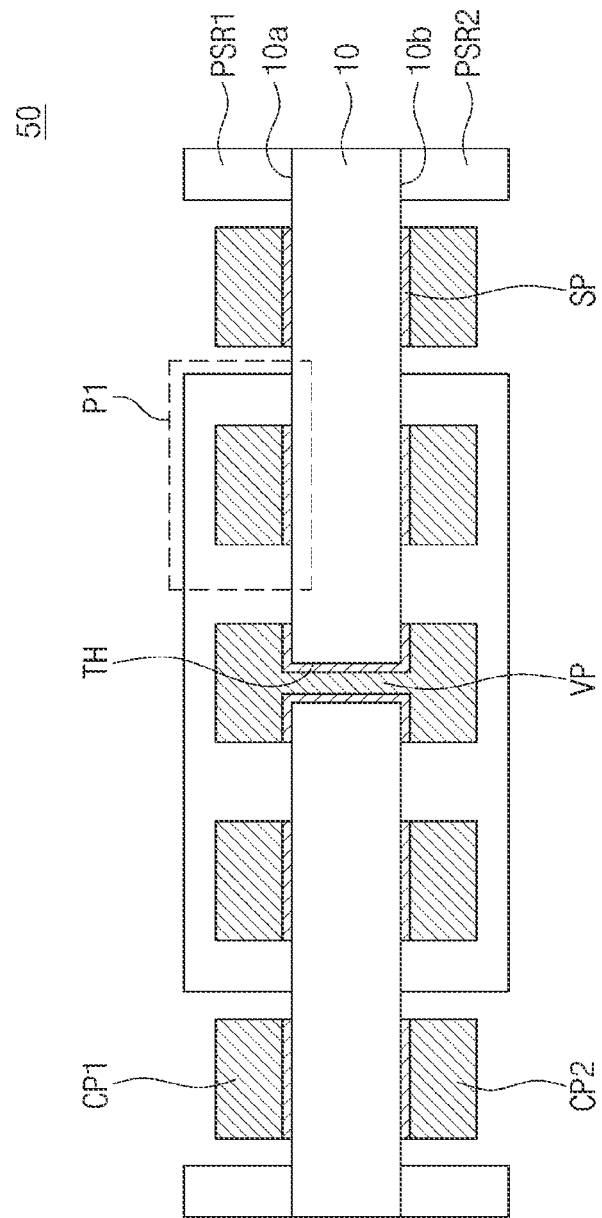

Referring to FIG. 1A, to manufacture a printed circuit board 50 of FIG. 1H, a substrate body portion 10 may be prepared first. The substrate body portion 10 may include a top surface 10a and a bottom surface 10b which are opposite to each other. At least one through-hole TH may be formed in the substrate body portion 10. The substrate body portion 10 may include, but not limited to, a thermosetting resin (e.g., epoxy resin), a thermoplastic resin (e.g., polyimide), a resin (e.g., prepreg) obtained by impregnating the thermosetting resin or the thermoplastic resin with a reinforcing material (e.g., a glass fiber and/or an inorganic filler), and/or a photocurable resin. As used herein the term "and/or" includes any and all combinations of one or more of the associated listed items.

Referring to FIG. 1B, a surface treatment may be performed on the top surface 10a and the bottom surface 10b of the substrate body portion 10. The surface treatment may allow the top surface 10a and the bottom surface 10b of the substrate body portion 10 to have a great surface roughness like the top surface 10a of FIG. 3A. The surface treatment may be, for example, an etching process. After the surface treatment, a seed layer SL may be conformally formed on an entire surface of the substrate body portion 10. The seed layer SL may include, for example, copper. The seed layer SL may be formed by, for example, a sputtering process and/or a physical vapor deposition (PVD) process. The seed layer SL may also be formed on an inner side surface of the through-hole TH.

Referring to FIG. 1C, a first photosensitive mask layer PR1 may be formed on the top surface 10a of the substrate body portion 10, and a second photosensitive mask layer PR2 may be formed on the bottom surface 10b of the substrate body portion 10. Each of the first photosensitive mask layer PR1 and the second photosensitive mask layer PR2 may include a multi-layered structure, i.e., stacked layers L1 to L5 having different properties.

The first photosensitive mask layer PR1 may include first to fifth sub-layers L1, L2, L3, L4 and L5 sequentially stacked on the top surface 10a. The second photosensitive mask layer PR2 may include first to fifth sub-layers L1, L2, L3, L4 and L5 sequentially stacked on the bottom surface 10b. Each of the first and second photosensitive mask layers PR1 and PR2 may also be referred to as "a photosensitive insulating layer".

Figure 2A:
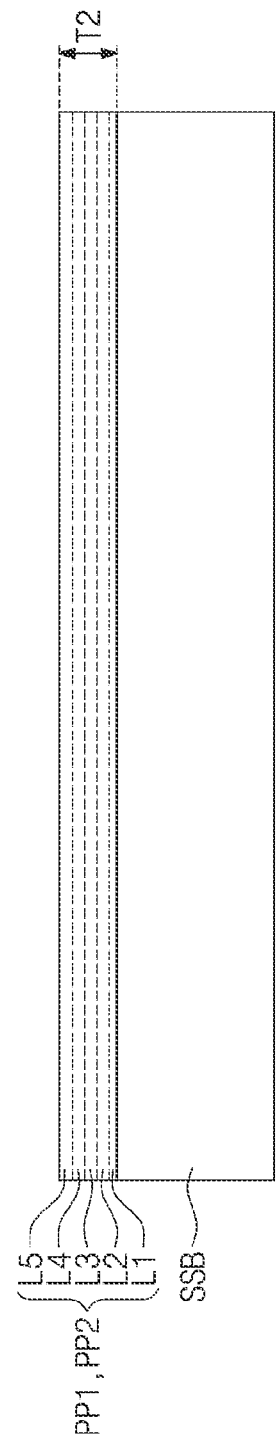
FIG. 2A is a cross-sectional view illustrating a process of forming first and second photosensitive mask layers according to some embodiments of the inventive concepts.

FIG. 2A is a cross-sectional view illustrating a process of forming first and second photosensitive mask layers according to some embodiments of the inventive concepts.

Referring to FIG. 2A, the first to fifth sub-layers L1, L2, L3, L4 and L5 may be sequentially formed on a sacrificial substrate (or a carrier substrate) SSB. Subsequently, the sacrificial substrate SSB may be removed to form the first and second photosensitive mask layers PR1 and PR2. The formation of the first to fifth sub-layers L1, L2, L3, L4 and L5 may be performed by a spray coating or spin coating process. Each of the first and second photosensitive mask layers PR1 and PR2 may be formed in a dry film shape.

Referring again to FIG. 1C, the substrate body portion 10 in the state of FIG. 1B may be located between the first and second photosensitive mask layers PR1 and PR2 having the dry film shapes, and then, heat and pressure may be applied thereto by a roll lamination process to bond the first and second photosensitive mask layers PR1 and PR2 onto the top and bottom surfaces 10a and 10b of the substrate body portion 10.

Even though not shown in the drawings, the fifth sub-layer L5 may be covered by a capping layer in the step of FIG. 2A, and the capping layer may be removed in the roll lamination process. The capping layer may include, for example, polyethylene terephthalate (PET) resin.

The first sub-layer L1 may include, for example, an amine compound and/or an amide compound. The first sub-layer L1 may include an amine group and/or an amide group. The amine group and/or the amide group included in the first sub-layer L1 may improve adhesive strength between the first sub-layer L1 and the surfaces 10a and 10b of the substrate body portion 10. The first sub-layer L1 may also be referred to as an adhesion promoter layer. The first sub-layer L1 may exclude a photosensitizer and an initiator. In some embodiments, the first sub-layer L1 may be devoid of a photosensitizer and an initiator. The first sub-layer L1 may have a first thickness T1, as illustrated in FIG. 2C. For example, the first thickness T1 may range from 20 Å to 2000 Å. Since the first thickness T1 is very small, the first sub-layer L1 may not affect a subsequent process of forming a pattern by exposure and development processes. Each of the first and second photosensitive mask layers PR1 and PR2 may have a second thickness T2, as illustrated in FIG. 2A. For example, the second thickness T2 may range from about 3 μm to about 30 μm.

Each of the second to fifth sub-layers L2 to L5 may have a thickness greater than the first thickness T1. For example, a third thickness T3 of the second sub-layer L2 may range from 1% to 10% of the second thickness T2. For example, the third thickness T3 may range from 0.03 μm to 3 μm.

Each of the second to fifth sub-layers L2 to L5 may function as a photoresist layer. The second to fifth sub-layers L2 to L5 may be formed by coating photosensitive composites (or photoresist composites) having different compositions/ingredients, respectively.

Each of the second to fifth sub-layers L2 to L5 (or the photosensitive composites for forming these sub-layers) may include a binder resin in amount of 50 wt % to 55 wt %, an initiator in amount of 3 wt % to 5 wt %, a dye in amount of 0.01 wt % to 0.6 wt %, and a polymerization inhibitor in amount of 0.001 wt % to 0.01 wt %. The polymerization inhibitor may include, for example, 4-methoxyphenol (MEHQ). The initiator may include, for example, 2,2'-Bis (2-chlorophenyl)-4,4',5,5'-tetraphenyl-1,2'-biimidazole (BCIM). Each of the second to fifth sub-layers L2 to L5 may further include an organic solvent. The organic solvent may include, for example, toluene or methanol.

Each of the second to fifth sub-layers L2 to L5 (or the photosensitive composites for forming these sub-layers) may further include a photosensitizer. Here, a content of the photosensitizer may be the lowest in the fifth sub-layer L5 and may be the highest in the second and third sub-layers L2 and L3. For example, the fifth sub-layer L5 may include the photosensitizer in amount of 0.1 wt % to 0.4 wt %, the fourth sub-layer L4 may include the photosensitizer in amount of 0.4 wt % to 0.7 wt %, and each of the second sub-layer L2 and the third sub-layer L3 may include the photosensitizer in amount of 0.7 wt % to 1.0 wt %. In some embodiments, the content of the photosensitizer in the second sub-layer L2 may be equal to or higher than the content of the photosensitizer in the third sub-layer L3. For example, the photosensitizer may include an anthracene-based material, e.g., 9,10-dibutoxy anthracene and/or coumarin 102. The photosensitizers of the second to fifth sub-layers L2 to L5 may be the same material or different materials. For example, the photosensitizer of the second sub-layer L2 may include a material different from the photosensitizer of the fourth sub-layer L4 and the photosensitizer of the fifth sub-layer L5. As used herein "a content of a photosensitizer" is also referred to as "a photosensitizer content."

A refractive index of the second sub-layer L2 may be lower than refractive indexes of the third to fifth sub-layers L3 to L5. For example, a first refractive index (n1) of the second sub-layer L2 may range from 1 to 1.44. The refractive indexes of the third to fifth sub-layers L3 to L5 may be equal to each other. Each of the third to fifth sub-layers L3 to L5 may have a second refractive index (n2). The second refractive index (n2) may range from 1.45 to 1.68. In this case, a first binder resin included in the second sub-layer L2 may be different from a second binder resin included in the third to fifth sub-layers L3 to L5. For example, a molecular weight of the first binder resin may be less than a molecular weight of the second binder resin.

When the first and second photosensitive mask layers PR1 and PR2 are a negative type, the first binder resin or the second binder resin may include methyl methacrylate, methacrylic acid, styrene, and/or benzyl methacrylate. When the first and second photosensitive mask layers PR1 and PR2 are a positive type, the first binder resin or the second binder resin may include a novolac resin.

Referring to FIG. 1D, exposure and development processes may be performed on the first and second photosensitive mask layers PR1 and PR2 to form first and second photosensitive mask patterns PP1 and PP2. First openings OP1 exposing the seed layer SL may be formed between the first photosensitive mask patterns PP1, and second openings OP2 exposing the seed layer SL may be formed between the second photosensitive mask patterns PP2. One of the first openings OP1 and one of the second openings OP2 may overlap with the through-hole TH. Since each of the first and second photosensitive mask layers PR1 and PR2 according to the embodiments of the inventive concepts includes the first to fifth sub-layers L1 to L5 stacked sequentially as described above, the first and second photosensitive mask patterns PP1 and PP2 may be formed without a pattern defect. This will be described hereinafter in detail. For example, a pitch of the first and second photosensitive mask patterns PP1 and PP2 may range from 10 nm to 20 μm.

Figure 2B:
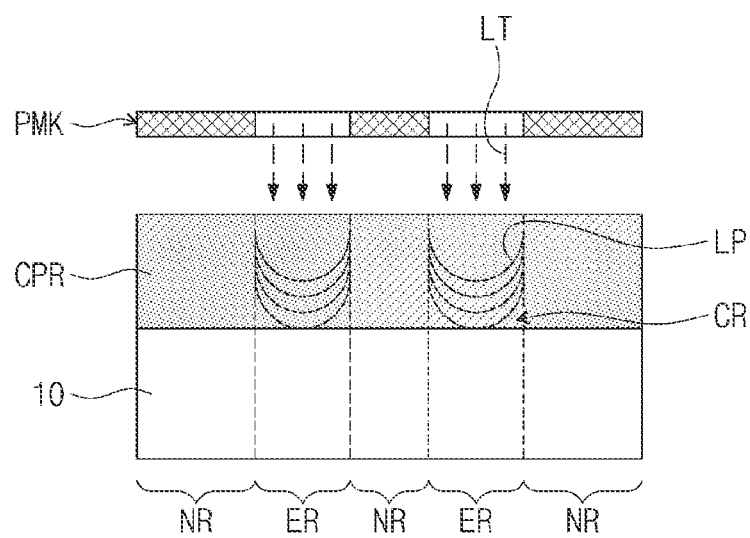
FIG. 2B is a cross-sectional view illustrating a typical photolithography process.
Figure 2C:
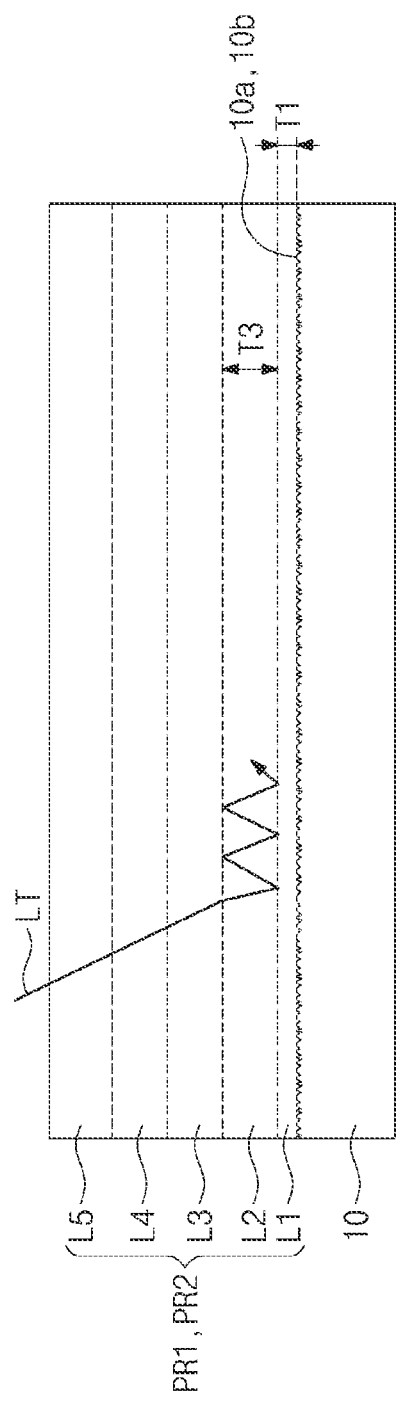
FIG. 2C illustrates a path of light in a photosensitive mask layer according to some embodiments of the inventive concepts.

FIG. 2B is a cross-sectional view illustrating a typical photolithography process.

Referring to FIG. 2B, a typical photoresist layer CPR may be formed of a single layer. Thus, the typical photoresist layer CPR may not have a change in content of the photosensitizer or a change in refractive index according to a depth, unlike the first and second photosensitive mask layers PR1 and PR2 according to the embodiments of the inventive concepts. In an exposure process, light LT incident through a photomask PMK may be incident into the photoresist layer CPR. When the photoresist layer CPR is a negative type, an exposed region ER may be removed in a development process and an unexposed region NR may remain after the development process, thereby forming a photoresist pattern. When the photoresist layer CPR is a positive type, the exposed region ER may not be removed in a development process since crosslinking reaction occurs in the exposed region ER, but the unexposed region NR may be removed in the development process, thereby forming a photoresist pattern.

In the exposure process, an intensity profile LP of light may have a parabolic shape. The amount of the light may decrease as a depth in the photoresist layer CPR increases, and thus it may be difficult for the light to reach a lower corner region CR. Accordingly, the lower corner region CR may not be exposed. Therefore, reaction by the exposure may not occur in the lower corner region CR.

When the photoresist layer CPR is the negative type, the lower corner region CR may not be removed by a developing solution of the development process but may remain as a residue to cause open failure. When the photoresist layer CPR is the positive type, the crosslinking reaction may not occur in the lower corner region CR, and thus a photoresist pattern formed after the development process may have an inverted triangle shape to cause failure such as leaning or collapse of a pattern.

FIG. 2C illustrates a path of light in a photosensitive mask layer according to some embodiments of the inventive concepts.

Referring to FIG. 2C, in the exposure process, light LT incident into the first and second photosensitive mask layers PR1 and PR2 may pass through the third to fifth sub-layers L3 to L5 having the same refractive index (i.e., the second refractive index (n2)) and then may be refracted at an interface between the second and third sub-layers L2 and L3 having different refractive indexes so as to be incident into the second sub-layer L2. At this time, since the first refractive index (n1) of the second sub-layer L2 is lower than the second refractive index (n2), the light LT may be refracted to be close to a direction perpendicular to the surfaces 10a and 10b of the substrate body portion 10.

If the first sub-layer L1 does not exist, the light LT may be reflected at the rough surfaces 10a and 10b of the substrate body portion 10. In this case, random diffraction, diffused reflection and scattering of the light LT may be increased by the rough surfaces 10a and 10b, and thus it may be difficult to control a path of the light LT. However, according to the embodiments of the inventive concepts, since the first sub-layer L1 exists on the rough surfaces 10a and 10b, the light LT may be reflected at an interface between the first sub-layer L1 and the second sub-layer L2. Since the interface between the first sub-layer L1 and the second sub-layer L2 is flat and the first refractive index (n1) of the second sub-layer L2 is lower than the second refractive index (n2), a scattering amount of the light LT in the second sub-layer L2 may be easily controlled and optical interference may be reduced or minimized. In addition, the light LT reflected at the interface between the first sub-layer L1 and the second sub-layer L2 may be reflected again at the interface between the second sub-layer L2 and the third sub-layer L3. Accordingly, a portion of the light LT may be trapped and scattered in the second sub-layer L2, and thus efficiency of the amount or intensity of light in the second sub-layer L2 may be increased.

In addition, in the first and second photosensitive mask layers PR1 and PR2 according to the embodiments of the inventive concepts, the contents of the photosensitizer in the second to fifth sub-layers L2 to L5 may be different from each other. The content of the photosensitizer may increase as a depth in each of the first and second photosensitive mask layers PR1 and PR2 increases. Thus, even though the intensity of light is reduced at a deep place, light reaction may be increased to increase a polymerization reaction rate and developability. In other words, the photosensitive mask layer according to the embodiments of the inventive concepts may include the stacked sub-layers of which the contents of the photosensitizer are different from each other, and thus the polymerization reaction rate according to a depth may be controlled. As a result, according to the embodiments of the inventive concepts, it is possible to reduce, minimize or prevent failure such as the open failure and/or the leaning or collapse of a pattern, and it is possible to form the fine photosensitive mask patterns PP1 and PP2 which have excellent pattern precision and good profiles of fine pitches. Thus, high resolution may be realized. The first sub-layer L1 may have a very thin thickness (e.g., the first thickness T1) and thus may be easily removed by a developing solution of the development process. Accordingly, formation and removal processes of an additional adhesive layer may not be required, and thus manufacturing processes may be simplified.

The light LT incident in FIG. 2C may have one wavelength (e.g., 365 nm, 193 nm or 13.5 nm). When the exposure process is performed using only the light LT of the one wavelength, the initiators included in the second to fifth sub-layers L2 to L5 may be the same as each other and may react with the light LT of the one wavelength.

Figure 2D:
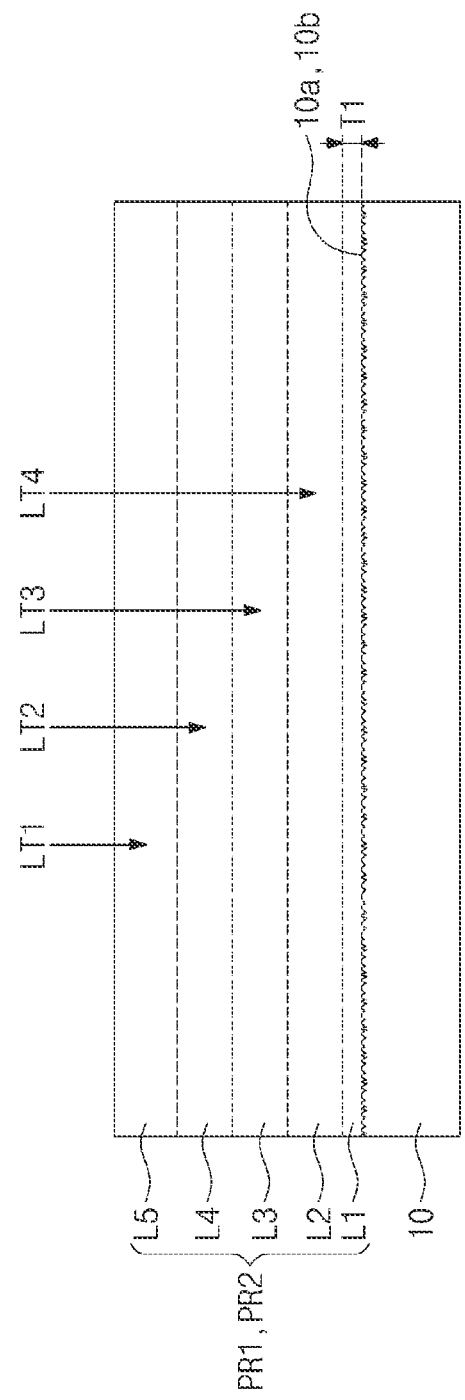
FIG. 2D illustrates paths of lights in a photosensitive mask layer according to some embodiments of the inventive concepts.

FIG. 2D illustrates paths of lights in a photosensitive mask layer according to some embodiments of the inventive concepts. FIG. 2D illustrates an example of an exposure process using lights LT1 to LT4 of various wavelengths.

Referring to FIG. 2D, in an exposure process, lights LT1 to LT4 of various wavelengths may be simultaneously or sequentially irradiated onto the first and second photosensitive mask layers PR1 and PR2. First light LT1 may have a first wavelength ($\lambda 1$). Second light LT2 may have a second wavelength ($\lambda 2$) longer than the first wavelength ($\lambda 1$). Third light LT3 may have a third wavelength ($\lambda 3$) longer than the second wavelength ($\lambda 2$). Fourth light LT4 may have a fourth wavelength ($\lambda 4$) longer than the third wavelength ($\lambda 3$). Thus, penetration depths of the lights LT1 to LT4 in the first and second photosensitive mask layers PR1 and PR2 may be different from each other. A penetration depth of light may increase as a wavelength of the light increases. In this case, kinds/materials of the initiators included in the second to fifth sub-layers L2 to L5 may be different from each other. For example, a first initiator included in the fifth sub-layer L5 may have strong reactivity to the first light LT1 of the first wavelength ($\lambda 1$) and may have weak reactivity to the second to fourth lights LT2 to LT4. The first initiator may react in response to the first light LT1 and may not react in response to the second to fourth lights LT2 to LT4. A second initiator included in the fourth sub-layer L4 may have strong reactivity to the second light LT2 of the second wavelength ($\lambda 2$) and may have weak reactivity to the first, third and fourth lights LT1, LT3 and LT4. The second initiator may react in response to the second light LT2 and may not react in response to the first, third and fourth lights LT1, LT3 and LT4. A third initiator included in the third sub-layer L3 may have strong reactivity to the third light LT3 of the third wavelength ($\lambda 3$) and may have weak reactivity to the first, second and fourth lights LT1, LT2 and LT4. The third initiator may react in response to the third light LT3 and may not react in response to the first, second and fourth lights LT1, LT2 and LT4. A fourth initiator included in the second sub-layer L2 may have strong reactivity to the fourth light LT4 of the fourth wavelength ($\lambda 4$) and may have weak reactivity to the first to third lights LT1 to LT3. The fourth initiator may react in response to the fourth light LT4 and may not react in response to the first to third lights LT1 to LT3. The first to fourth initiators may be different from each other. One of the first to fourth initiators may include, for example, 2,2'-Bis (2-chlorophenyl)-4,4',5,5'-tetraphenyl-1,2'-biimidazole (BCIM). Since the second to fifth sub-layers L2 to L5 include different initiators as described above, resolution may be increased and precise patterning may be realized.

In FIG. 1C, when the second to fifth sub-layers L2 to L5 of the first and second photosensitive mask layers PR1 and PR2 have a positive type resin, a soft baking process may be performed before the exposure process, and/or a hard baking process may be performed after the development process.

Referring to FIG. 1E, a plating process may be performed to form first conductive patterns CP1 filling the first openings OP1, second conductive patterns CP2 filling the second openings OP2, and a via pattern VP filling the through-hole TH. The plating process may be performed by, for example, an electroless plating process. The first conductive patterns CP1, the second conductive patterns CP2 and the via pattern VP may include, for example, copper.

Referring to FIG. 1F, the first and second photosensitive mask patterns PP1 and PP2 may be removed to expose the seed layer SL. The removal of the first and second photosensitive mask patterns PP1 and PP2 may be performed by, for example, an ashing process.

Referring to FIG. 1G, the seed layer SL exposed at sides of the first conductive patterns CP1 and the second conductive patterns CP2 may be removed to expose the surfaces 10a and 10b of the substrate body portion 10 and to form seed patterns SP.

Referring to FIG. 1H, a first photosensitive insulating layer PSR1 may be formed on the top surface 10a of the substrate body portion 10. A second photosensitive insulating layer PSR2 may be formed on the bottom surface 10b of the substrate body portion 10. Thus, the printed circuit board 50 may be manufactured. Each of the first photosensitive insulating layer PSR1 and the second photosensitive insulating layer PSR2 may also be referred to as "a photosensitive solder resist layer".

Figure 3A:
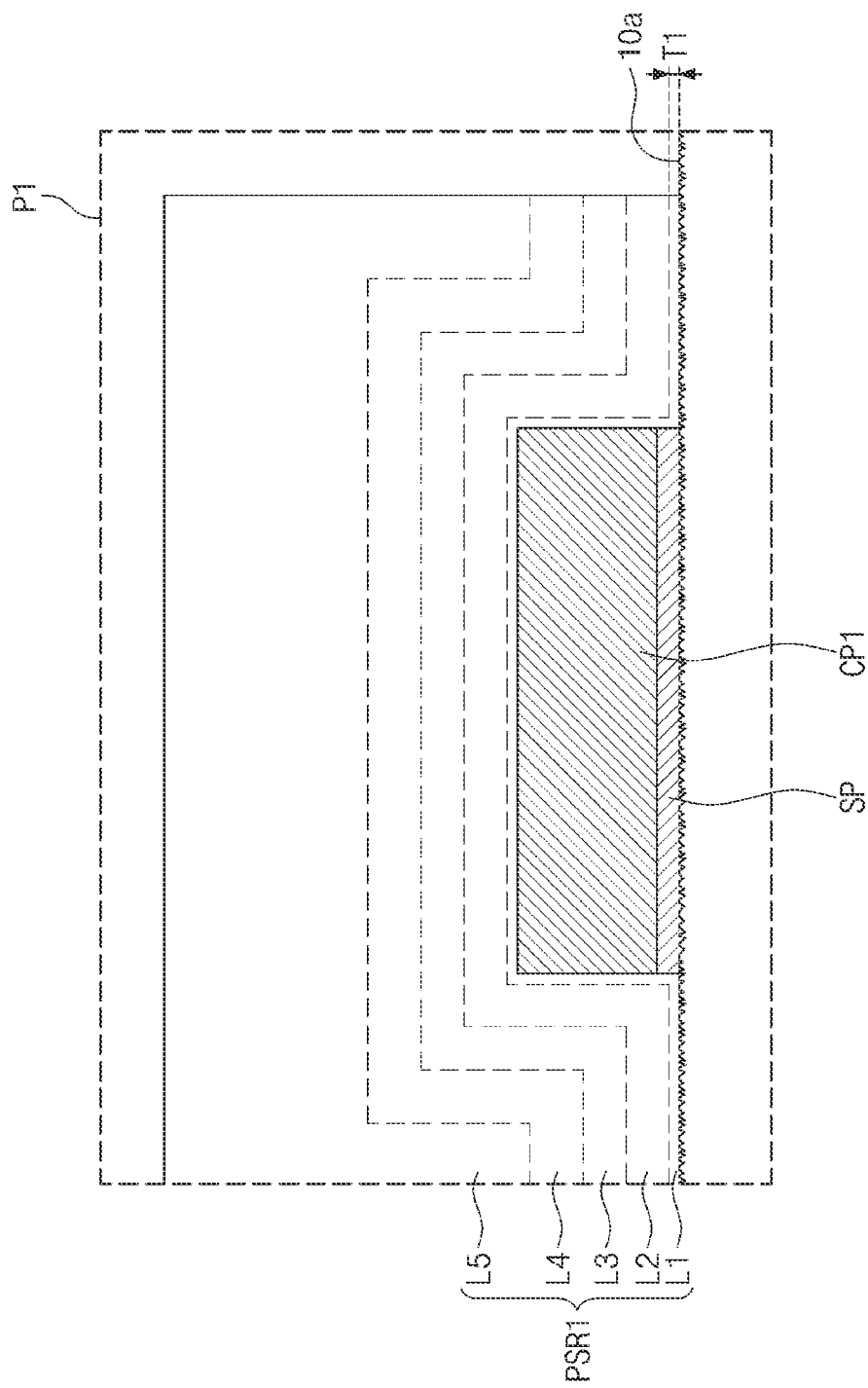
FIGS. 3A and 3B are enlarged views of a portion 'P1' of FIG. 1H according to some embodiments of the inventive concepts.
Figure 3B:
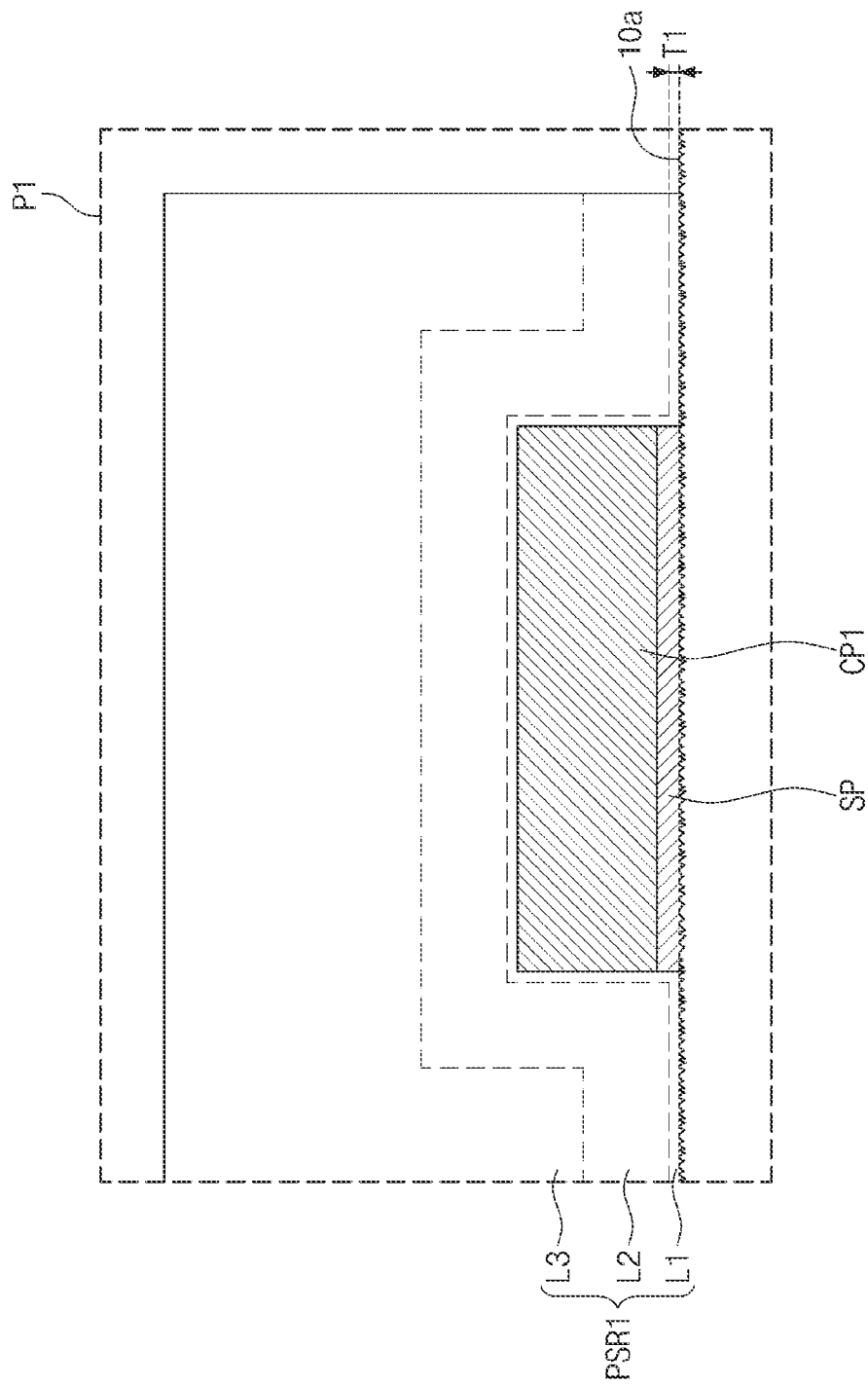

FIGS. 3A and 3B are enlarged views of a portion 'P1' of FIG. 1H according to some embodiments of the inventive concepts.

Referring to FIG. 3A, each of the first and second photosensitive insulating layers PSR1 and PSR2 may include stacked layers L1 to L5 having different properties. The first photosensitive insulating layer PSR1 may include first to fifth sub-layers L1 to L5 sequentially stacked on the top surface 10a of the substrate body portion 10. The second photosensitive insulating layer PSR2 may also include first to fifth sub-layers L1 to L5 sequentially stacked on the bottom surface 10b of the substrate body portion 10. The first photosensitive insulating layer PSR1 and the second photosensitive insulating layer PSR2 may cover some of the first and second conductive patterns CP1 and CP2 and may expose others thereof.

The first photosensitive insulating layer PSR1 and the second photosensitive insulating layer PSR2 may be formed by a method the same as or similar to the method of forming the first and second photosensitive mask patterns PP1 and PP2 of FIG. 1D.

In some embodiments, the first to fifth sub-layers L1 to L5 may be sequentially and conformally stacked on each of the top and bottom surfaces 10a and 10b of the substrate body portion 10 of FIG. 1H, and then, exposure and development processes may be performed to form each of the first and second photosensitive insulating layers PSR1 and PSR2. The first to fifth sub-layers L1 to L5 may be the same as or similar to the first to fifth sub-layers L1 to L5 of each of the first and second photosensitive mask layers PR1 and PR2 described above. Like FIG. 3A, the first to fifth sub-layers L1 to L5 may conformally cover the first and second conductive patterns CP1 and CP2.

In some embodiments, referring to FIG. 3B, each of the first photosensitive insulating layer PSR1 and the second photosensitive insulating layer PSR2 may include first to third sub-layers L1 to L3 stacked sequentially. The first sub-layer L1 may be the same as or similar to the first sub-layer L1 described with reference to FIGS. 1A to 2C. In some embodiments, the first sub-layer L1 of the first photosensitive insulating layer PSR1 and the second photosensitive insulating layer PSR2 may include an amine compound and/or an amide compound and may function as an adhesion promoter layer. The first sub-layer L1 may exclude a photosensitizer. In some embodiments, the first sub-layer L1 may be devoid of a photosensitizer. The first sub-layer L1 may have the first thickness T1, as illustrated in FIG. 2C.

In FIG. 3B, the second sub-layer L2 may be the same as or similar to the second sub-layer L2 described with reference to FIGS. 1A to 2C. The third sub-layer L3 may correspond to the fourth sub-layer L4 or fifth sub-layer L5 described with reference to FIGS. 1A to 2C. For example, each of the second and third sub-layers L2 and L3 may include a binder resin in amount of 50 wt % to 55 wt %, an initiator in amount of 3 wt % to 5 wt %, a dye in amount of 0.01 wt % to 0.6 wt %, and a polymerization inhibitor in amount of 0.001 wt % to 0.01 wt %. The polymerization inhibitor may include, for example, 4-methoxyphenol (MEHQ). The initiator may include, for example 2,2'-Bis (2-chlorophenyl)-4,4',5,5'-tetraphenyl-1,2'-biimidazole (BCIM). Each of the second and third sub-layers L2 and L3 may further include an organic solvent. The organic solvent may include, for example, toluene or methanol.

Each of the second and third sub-layers L2 and L3 may further include a photosensitizer. A content of the photosensitizer included in the second sub-layer L2 may be higher than a content of the photosensitizer included in the third sub-layer L3. For example, the third sub-layer L3 may include the photosensitizer in amount of 0.1 wt % to 0.7 wt %, and the second sub-layer L2 may include the photosensitizer in amount of 0.7 wt % to 1.0 wt %. The photosensitizer may include, for example, 9,10-dibutoxy anthracene and/or coumarin 102.

A refractive index of the second sub-layer L2 may be lower than a refractive index of the third sub-layer L3. For example, a first refractive index (n1) of the second sub-layer L2 may range from 1 to 1.44. The third sub-layer L3 may have a second refractive index (n2). The second refractive index (n2) may range from 1.45 to 1.68. In this case, a first binder resin included in the second sub-layer L2 may be different from a second binder resin included in the third sub-layer L3. For example, a molecular weight of the first binder resin may be less than a molecular weight of the second binder resin.

The printed circuit board 50 of FIG. 1H manufactured by the method may include the fine patterns CP1, CP2, PSR1 and PSR2 having excellent profiles and precision. Thus, a highly integrated printed circuit board with improved reliability may be realized.

Figure 4:
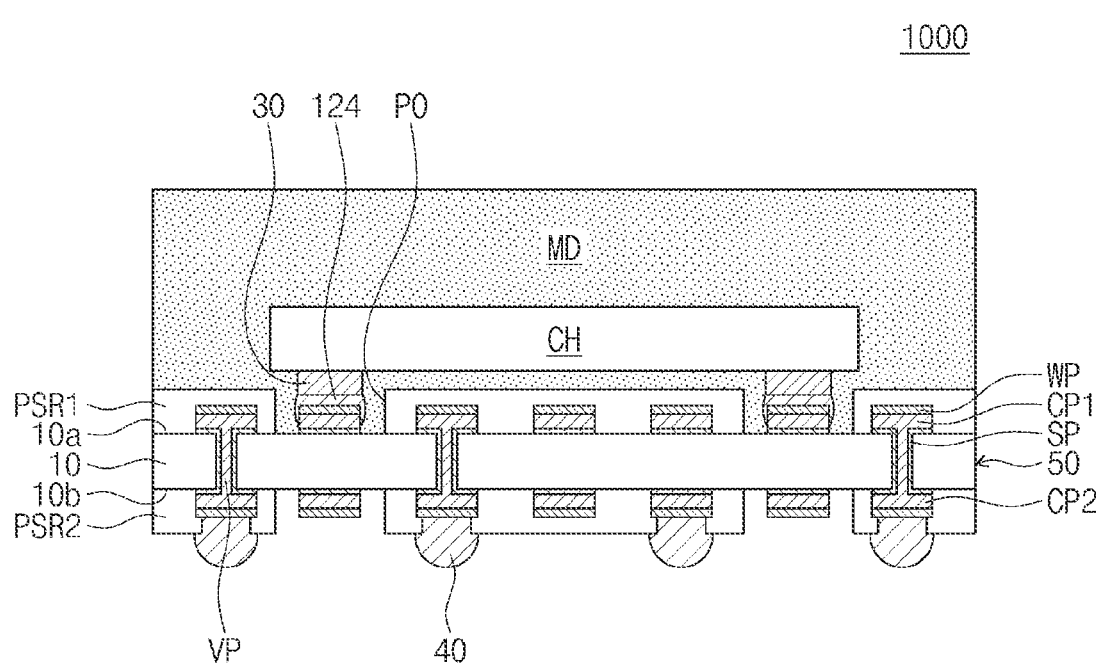
FIG. 4 is a cross-sectional view illustrating a semiconductor package according to some embodiments of the inventive concepts.

FIG. 4 is a cross-sectional view illustrating a semiconductor package according to some embodiments of the inventive concepts.

Referring to FIG. 4, a semiconductor package 1000 according to the present embodiments may have a structure in which a semiconductor device CH is mounted on the printed circuit board 50 of FIG. 1H. In the present embodiments, the printed circuit board 50 may also be referred to as a package substrate (or a substrate). A wetting layer WP may be formed on each of the first and second conductive patterns CP1 and CP2 of the printed circuit board 50. The wetting layer WP may include, for example, gold. Even though not shown in the drawings, a diffusion barrier layer may be disposed between the wetting layer WP and each of the first and second conductive patterns CP1 and CP2. The diffusion barrier layer may include, for example, nickel.

For example, the semiconductor device CH may be an image sensor chip (e.g., a CMOS imaging sensor (CIS)), a memory device chip (e.g., a flash memory chip, a DRAM chip, a SRAM chip, an EEPROM chip, a PRAM chip, a MRAM chip, a ReRAM chip, a high bandwidth memory (HBM) chip, or a hybrid memory cubic (HMC) chip), a microelectromechanical system (MEMS) device chip, or an application specific integrated circuit (ASIC) chip.

A chip conductive bump 30 may be bonded to the semiconductor device CH. A solder layer 124 may be disposed between the chip conductive bump 30 and the wetting layer WP. The solder layer 124 may include, for example, at least one of tin or lead. The solder layer 124 may extend to cover a side surface of the first conductive pattern CP1.

The semiconductor device CH and the printed circuit board 50 may be covered by a mold layer MD. For example, the mold layer MD may include an insulating resin such as epoxy molding compound (EMC). The mold layer MD may further include fillers, and the fillers may be dispersed in the insulating resin. The fillers may include, for example, silicon oxide ($SiO_2$).

External connection terminals 40 may be bonded to some of the second conductive patterns CP2. The external connection terminals 40 may be, for example, solder balls. The external connection terminals 40 may include, for example, at least one of tin or lead.

In the semiconductor package 1000, the first and second photosensitive insulating layers PSR1 and PSR2 of the printed circuit board 50 may be the same as or similar to the first and second photosensitive insulating layers PSR1 and PSR2 described with reference to FIGS. 3A and 3B.

The photosensitive mask patterns PP1 and PP2 described with reference to FIGS. 1A to 1D may be applied to a patterning process of a general semiconductor manufacturing process.

FIGS. 5A to 5D are cross-sectional views illustrating a process of forming a pattern according to some embodiments of the inventive concepts.

Figure 5A:
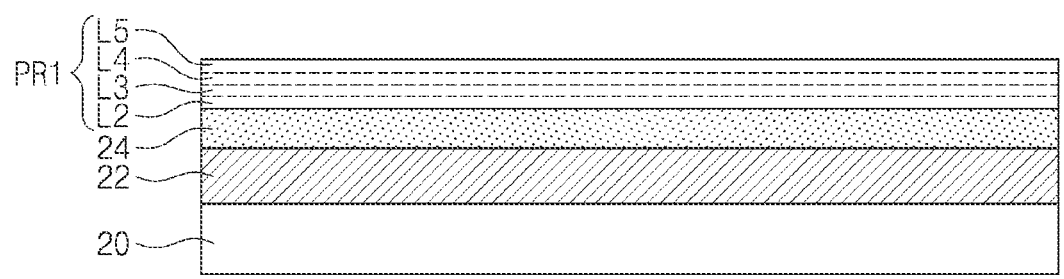
FIGS. 5A to 5D are cross-sectional views illustrating a process of forming a pattern according to some embodiments of the inventive concepts.

Referring to FIG. 5A, an etch-target layer 22 may be formed on a substrate 20. The etch-target layer 22 may be, for example, a conductive layer or an insulating layer. A first mask layer 24 may be formed on the etch-target layer 22. The first mask layer 24 may include a material having an etch selectivity with respect to the etch-target layer 22. For example, the first mask layer 24 may include silicon oxide, silicon nitride, or poly-silicon. A first photosensitive mask layer PR1 may be formed on the first mask layer 24. The first photosensitive mask layer PR1 may include second to fifth sub-layers L2 to L5 stacked sequentially. The first photosensitive mask layer PR1 may exclude the first sub-layer L1 described with reference to FIG. 1C. In other words, when a top surface of the first mask layer 24 is flat and adhesive failure between the first mask layer 24 and the second sub-layer L2 of the first photosensitive mask layer PR1 does not occur, the first sub-layer L1 functioning as the adhesion promoter layer may be omitted. The second to fifth sub-layers L2 to L5 of the first photosensitive mask layer PR1 may be sequentially formed directly on the first mask layer 24 by sequentially performing spin and/or spray coating processes, without the sacrificial substrate SSB of FIG. 2A. The second to fifth sub-layers L2 to L5 may be the same as or similar to the second to fifth sub-layers L2 to L5 described with reference to FIG. 1C.

Figure 5B:
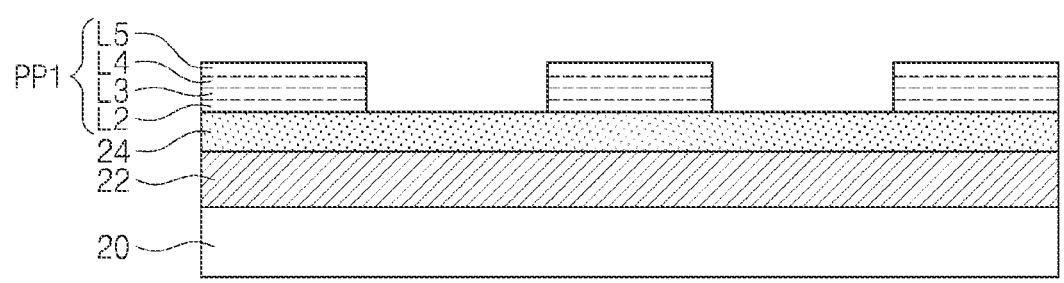
Figure 5C:
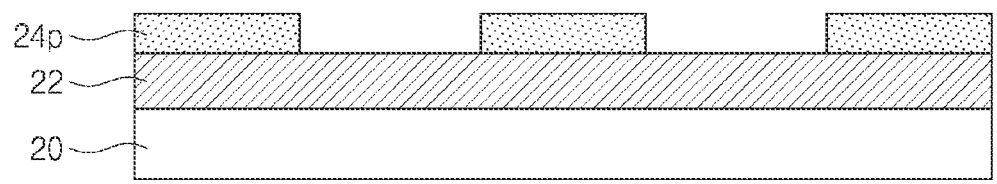
Figure 5D:
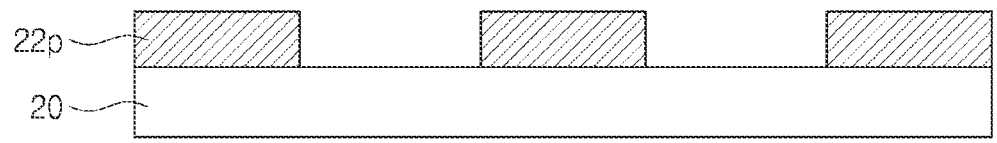

Referring to FIG. 5B, exposure and development processes may be performed on the first photosensitive mask layer PR1 to form first photosensitive mask patterns PP1. Subsequently, the first mask layer 24 may be etched using the first photosensitive mask patterns PP1 of FIG. 5B as etch masks to form first mask patterns 24p of FIG. 5C. Next, the etch-target layer 22 may be etched using the first mask patterns 24p as etch masks to form desired patterns 22p as illustrated in FIG. 5D. Thus, fine patterns 22p having excellent profiles and precisions may be formed.

Figure 6:
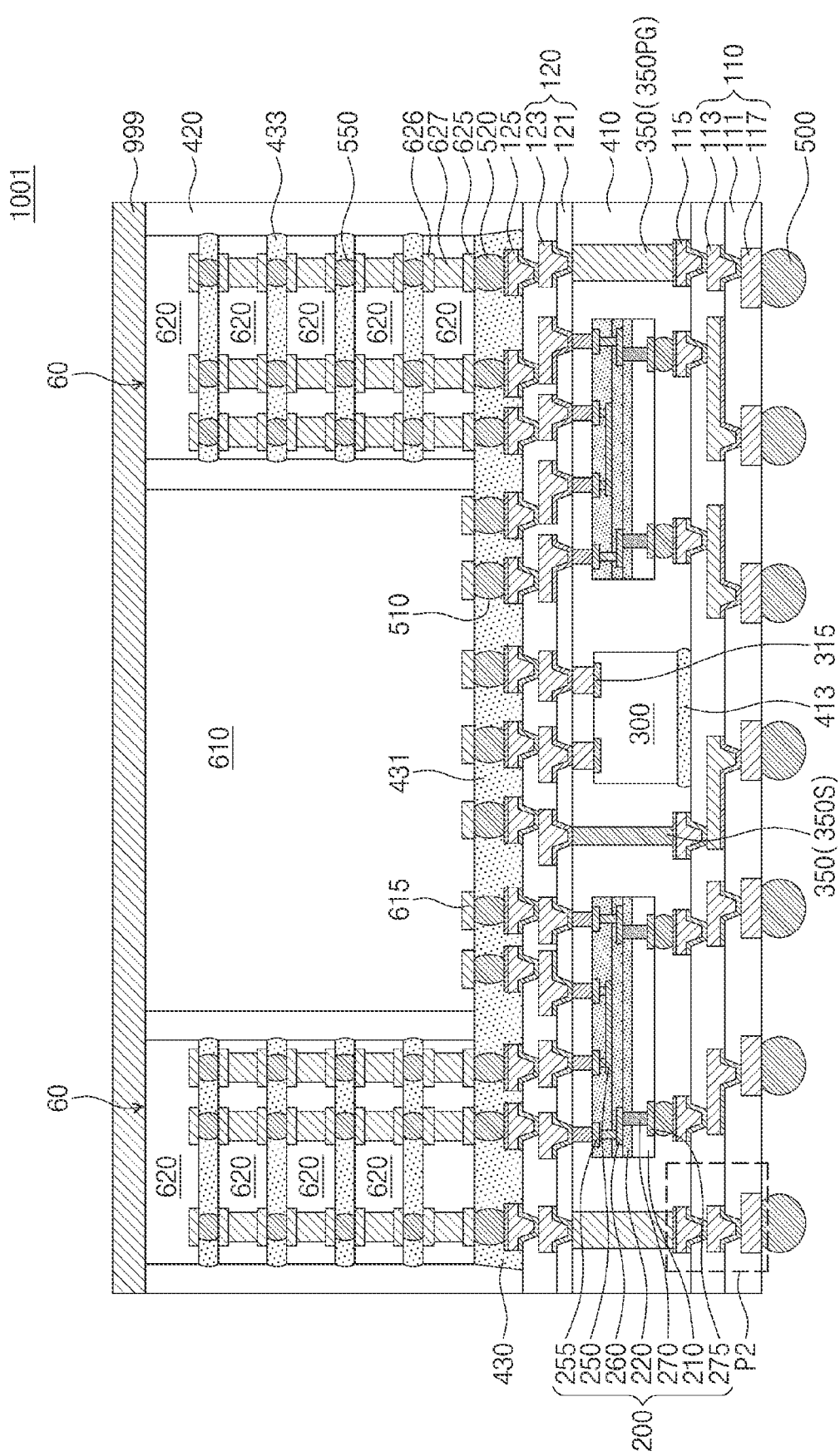
FIG. 6 is a cross-sectional view illustrating a semiconductor package according to some embodiments of the inventive concepts.

FIG. 6 is a cross-sectional view illustrating a semiconductor package according to some embodiments of the inventive concepts.

Referring to FIG. 6, a semiconductor package 1001 may include external connection terminals 500, an interposer structure, a second semiconductor device 610, and chip stacks 60. The interposer structure may include a first redistribution layer 110, first redistribution pads 115, a second redistribution layer 120, second redistribution pads 125, bridge structures 200, a first semiconductor device 300, an adhesive film 413, and conductive structures 350.

The first redistribution layer 110 may include first insulating layers 111, under bump patterns 117, and first redistribution patterns 113. The first insulating layers 111 may include, for example, a photo-imageable dielectric (PID). The first insulating layers 111 will be described later in detail.

The under bump patterns 117 may be provided in a lowermost first insulating layer 111. Bottom surfaces of the under bump patterns 117 may not be covered by the lowermost first insulating layer 111. The under bump patterns 117 may function as pads of the external connection terminals 500. The under bump patterns 117 may be laterally spaced apart from each other and may be insulated from each other. It may be understood that when two components are laterally spaced apart from each other, they may be horizontally spaced apart from each other. The term "horizontal" may mean a direction parallel to a bottom surface of the lowermost first insulating layer 111. The lowermost first insulating layer 111 may cover top surfaces and side surfaces of the under bump patterns 117. The under bump patterns 117 may include a metal material such as copper.

The first redistribution patterns 113 may be provided on the under bump patterns 117, respectively. The first redistribution patterns 113 may be laterally spaced apart from each other and may be electrically separated from each other. The first redistribution patterns 113 may penetrate a portion of the lowermost first insulating layer 111 so as to be adjacent to the under bump patterns 117. A barrier/seed pattern BSP of FIG. 7A may be disposed between each of the first redistribution patterns 113 and the lowermost first insulating layer 111. The barrier/seed pattern BSP may include, for example, a titanium layer and a copper layer which are sequentially stacked. In the present embodiments, the first redistribution patterns 113 constitute a single layer. Alternatively, the first redistribution patterns 113 may constitute a multi-layer.

The external connection terminals 500 may be electrically connected to the first redistribution patterns 113 through the under bump patterns 117. The external connection terminals 500 may include a solder material. The solder material may include, for example, tin, bismuth, lead, silver, or any alloy thereof.

The first redistribution pads 115 may be disposed on an uppermost first insulating layer 111. A wetting layer WP may be located on each of the first redistribution pads 115.

The bridge structure 200 may be disposed on a top surface of the first redistribution layer 110. The top surface of the first redistribution layer 110 may correspond to a top surface of the uppermost first insulating layer 111. The bridge structure 200 may include a base substrate 210, insulating patterns 220, a connection structure 250, and connection pads 255. The bridge structure 200 may not include integrated circuits. However, the inventive concepts are not limited thereto. In some embodiments, the bridge structure

200 may include integrated circuits, and in this case, the bridge structure 200 may function as a semiconductor chip or a semiconductor device.

For some examples, the base substrate 210 may be a semiconductor substrate such as a silicon substrate. In some embodiments, the base substrate 210 may include an organic substrate. The organic substrate may include an insulating polymer. The insulating patterns 220 may be vertically stacked on a top surface of the base substrate 210. The insulating patterns 220 may include a silicon-based insulating material or an organic insulating material. The silicon-based insulating material may include, for example, silicon oxide, silicon nitride, silicon oxynitride, silicon oxycarbide, and/or any combination thereof. The organic insulating material may include an insulating polymer.

The connection pads 255 may be disposed in an uppermost insulating pattern 220 or on the uppermost insulating pattern 220. Top surfaces of the connection pads 255 may not be covered by the uppermost insulating pattern 220. The connection pads 255 may be laterally spaced apart from each other. The connection pads 255 may include a metal such as copper, aluminum, and/or tungsten. The connection structure 250 may be provided in the insulating patterns 220 so as to be connected to at least two of the connection pads 255. The connection structure 250 may be provided in plurality, and the plurality of connection structures 250 may be insulated from each other. Each of the connection structures 250 may include conductive vias and a conductive interconnection line. The conductive vias may be disposed between the conductive interconnection line and the connection pads 255, respectively. It may be understood that when a component is connected to the bridge structure 200, it may be connected to the connection structure 250. The connection structure 250 may include a metal such as copper, titanium, and/or tungsten.

Through-structures 270 may be provided in the base substrate 210. The through-structures 270 may be disposed on lower connection pads 275 and may be connected to the lower connection pads 275. The through-structures 270 may further penetrate a portion of the insulating patterns 220. The through-structures 270 may include a conductive material such as copper, titanium, tungsten, and/or any alloy thereof.

Metal patterns 260 may be disposed in the insulating patterns 220 or between the insulating patterns 220. The metal patterns 260 may be connected to some of the connection pads 255 and the through-structures 270, respectively. Each of the metal patterns 260 may include a metal via and a metal line. The metal via may penetrate at least one of the insulating patterns 220. The metal line may be disposed between the insulating patterns 220. The connection structure 250 may be disposed between the metal patterns 260 and may be insulated from the metal patterns 260. Since the metal patterns 260 are provided, at least one of the through-structures 270 may not be vertically aligned with the connection pad 255 electrically connected thereto. Thus, restrictions on arrangement of the lower connection pads 275 and the connection pads 255 may be reduced or minimized. In some embodiments, the metal patterns 260 may be omitted, and the through-structures 270 may be connected directly to corresponding ones of the connection pads 255 and the lower connection pads 275, respectively.

The first semiconductor device 300 may be disposed on the top surface of the uppermost first insulating layer 111 and may be laterally spaced apart from the bridge structures 200. Terminals 315 may be provided on a top surface of the first semiconductor device 300. The terminals 315 may include a conductive material such as a metal. The first semiconductor device 300 may be a passive device or an active device. The passive device may be, for example, a capacitor. In some embodiments, the passive device may include an inductor or a resistor.

The adhesive film 413 may be disposed between the first redistribution layer 110 and the first semiconductor device 300. The first semiconductor device 300 may be adhered to the first redistribution layer 110 through the adhesive film 413. The adhesive film 413 may have an insulating property. The adhesive film 413 may be, for example, a die attach film.

The second redistribution layer 120 may be disposed on the bridge structures 200, the first semiconductor device 300, and the conductive structures 350. The second redistribution layer 120 may be vertically spaced apart from the first redistribution layer 110. The second redistribution layer 120 may include second insulating layers 121 and second redistribution patterns 123. The second insulating layers 121 may be vertically stacked.

The second redistribution patterns 123 may be provided in the second insulating layers 121 and on a top surface of the second insulating layer 121. The second redistribution patterns 123 may be spaced apart from each other and may be insulated from each other.

The second redistribution pads 125 may be disposed on an uppermost second insulating layer 121. The second redistribution pads 125 may be laterally spaced apart from each other. The second redistribution pads 125 may be disposed on the second redistribution patterns 123 and may be connected to the second redistribution patterns 123.

The second semiconductor device 610 may be mounted on a top surface of the second redistribution layer 120. The second semiconductor device 610 may include integrated circuits (not shown) and chip pads 615. The integrated circuits of the second semiconductor device 610 may be provided in the second semiconductor device 610. The chip pads 615 may be disposed on a bottom surface of the second semiconductor device 610 and may be electrically connected to the integrated circuits.

The second semiconductor device 610 may be, for example, a logic chip, a buffer chip, or a system-on-chip (SOC). The second semiconductor device 610 may include, for example, an ASIC chip or an application processor (AP) chip. The ASIC chip may include an application specific integrated circuit (ASIC). In some embodiments, the second semiconductor device 610 may include a central processing unit (CPU) or a graphic processing unit (GPU).

First bonding bumps 510 may be provided between the chip pads 615 of the second semiconductor device 610 and corresponding ones of the second redistribution pads 125 so as to be connected to the chip pads 615 and the corresponding second redistribution pads 125, respectively. Thus, the second semiconductor device 610 may be connected to the second redistribution patterns 123 through the first bonding bumps 510. It may be understood that when a component is connected to the second redistribution layer 120, it may be connected to at least one of the second redistribution patterns 123. Each of the first bonding bumps 510 may include solder, a pillar, and/or a combination thereof. The first bonding bumps 510 may include a solder material or copper.

The chip stack 60 may be mounted on the top surface of the second redistribution layer 120. The chip stack 60 may be disposed on the top surface of an edge region of the second redistribution layer 120. The edge region of the second redistribution layer 120 may be provided between a side surface and a center region of the second redistribution layer 120 when viewed in a plan view. The edge region of the second redistribution layer 120 may surround the center region. The chip stack 60 may be laterally spaced apart from the second semiconductor device 610. The chip stack 60 may be provided in plurality, and the second semiconductor device 610 may be disposed between the plurality of chip stacks 60 when viewed in a plan view. The number of the chip stacks 60 may be variously changed. In some embodiments, the semiconductor package 1001 may include a single chip stack 60.

Each of the chip stacks 60 may include a plurality of second semiconductor chips 620 stacked sequentially. The second semiconductor chips 620 may include integrated circuits therein. Kinds of the second semiconductor chips 620 may be different from that of the second semiconductor device 610. For example, a lowermost second semiconductor chip 620 may be a logic chip, and the others of the second semiconductor chips 620 may be memory chips. The memory chip may include a high bandwidth memory (HBM) chip. A kind of the logic chip of the lowermost second semiconductor chip 620 may be different from that of the logic chip of the second semiconductor device 610. For example, the lowermost second semiconductor chip 620 may be a controller chip and may control the memory chips. In some embodiments, the lowermost second semiconductor chip 620 may be a memory chip.

Each of the second semiconductor chips 620 may include lower pads 625, through-electrodes 627, and upper pads 626. The lower pads 625 and the upper pads 626 may be provided on a bottom surface and a top surface of the second semiconductor chip 620, respectively. The lower pads 625 and the upper pads 626 may be electrically connected to the integrated circuits of the second semiconductor chip 620.

Each of the chip stacks 60 may further include interposer bumps 550. The interposer bumps 550 may be disposed between adjacent two second semiconductor chips 620 so as to be connected to the lower pads 625 and the upper pads 626 of the adjacent two second semiconductor chips 620. Thus, the plurality of second semiconductor chips 620 may be electrically connected to each other. Each of the interposer bumps 550 may include solder, a pillar, and/or a combination thereof.

Each of the chip stacks 60 may further include upper underfill layers 433. The upper underfill layers 433 may be respectively provided in third gap regions between the second semiconductor chips 620 to seal or encapsulate the interposer bumps 550. The upper underfill layer 433 may include an insulating polymer such as an epoxy-based polymer.

Second bonding bumps 520 may be disposed between the lowermost second semiconductor chip 620 and the second redistribution layer 120 so as to be connected to the lower pads 625 and corresponding ones of the second redistribution pads 125, respectively. Thus, the second semiconductor chips 620 may be connected to the second redistribution patterns 123. Each of the second bonding bumps 520 may include solder, a pillar, and/or a combination thereof. The second bonding bumps 520 may include, but not limited to, a solder material or copper.

The conductive structures 350 may be disposed between the first redistribution layer 110 and the second redistribution layer 120 so as to be electrically connected to the first redistribution layer 110 and the second redistribution layer 120. The conductive structures 350 may be laterally spaced apart from the bridge structures 200 and the first semiconductor device 300. The conductive structures 350 may be laterally spaced apart from each other. The conductive structures 350 may be disposed on and connected to corresponding ones of the first redistribution pads 115, respectively. The conductive structures 350 may be electrically connected to the external connection terminals 500 through the first redistribution layer 110. It may be understood that when a component is electrically connected to the first redistribution layer 110, it may be electrically connected to at least one of the first redistribution patterns 113. The conductive structures 350 may include a metal such as copper, tungsten, and/or an alloy thereof.

The conductive structures 350 may include first conductive structures 350S and second conductive structures 350PG. The first conductive structures 350S may be signal structures. For example, the first conductive structures 350S may transmit data signals of the second semiconductor device 610 or the second semiconductor chips 620 to the external connection terminals 500.

The second conductive structures 350PG may be spaced apart from and electrically insulated from the first conductive structures 350S. The second conductive structures 350PG may include at least one of a ground/power structure or a SerDes structure. The ground/power structure may include at least one of a ground structure or a power structure. The ground/power structure may be a path for supplying a ground voltage or a power voltage to the second semiconductor device 610 or the second semiconductor chips 620. The SerDes structure may be an electrical connection path between a pair of blocks. Here, the pair of blocks may convert series data and parallel interface. One of the pair of blocks may be provided in the second semiconductor device 610 or the second semiconductor chip 620. Widths of the second conductive structures 350PG may be greater than widths of the first conductive structures 350S.

A lower mold layer 410 may be provided between the first redistribution layer 110 and the second redistribution layer 120 to fill a gap region between the first redistribution layer 110 and the second redistribution layer 120. An upper mold layer 420 may be disposed on the top surface of the second redistribution layer 120 to cover a side surface of the second semiconductor device 610 and side surfaces of the second semiconductor chips 620. An underfill layer 430 may be provided in a first gap region between the second redistribution layer 120 and the second semiconductor device 610 and may extend into second gap regions between the second redistribution layer 120 and the chip stacks 60. A heat dissipation structure 999 may be disposed on a top surface of the second semiconductor device 610, top surfaces of the chip stacks 60, and a top surface of the upper mold layer 420. The heat dissipation structure 999 may further extend onto a side surface of the upper mold layer 420. The heat dissipation structure 999 may include a material having high thermal conductivity and thus may function as a heat sink or a heat slug. For example, in operation of the semiconductor package 1001, heat generated from the second semiconductor device 610 or the second semiconductor chips 620 may be rapidly dissipated or released through the heat dissipation structure 999. For example, the heat dissipation structure 999 may include a metal (e.g., copper). The heat dissipation structure 999 may absorb an external physical impact to protect the second semiconductor device 610 and the chip stacks 60.

The heat dissipation structure 999 may have electrical conductivity and thus may also function as an electromagnetic wave shielding layer. For example, the heat dissipation structure 999 may shield electromagnetic interference (EMI) of the second semiconductor device 610 and the second semiconductor chips 620. In this case, the heat dissipation structure 999 may be grounded through the second redistribution layer 120 to prevent electrical damage of the second semiconductor device 610 or the second semiconductor chips 620 by electrostatic discharge (ESD).

Figure 7A:
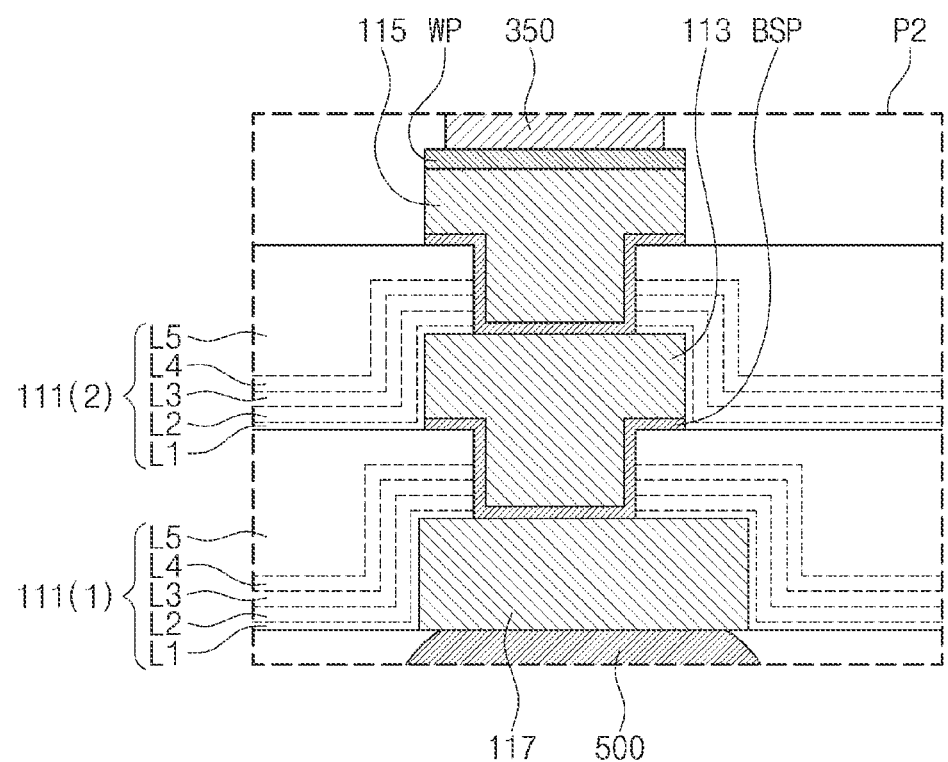
FIGS. 7A to 7C are enlarged views of a portion 'P2' of FIG. 6 according to some embodiments of the inventive concepts.
Figure 7B:
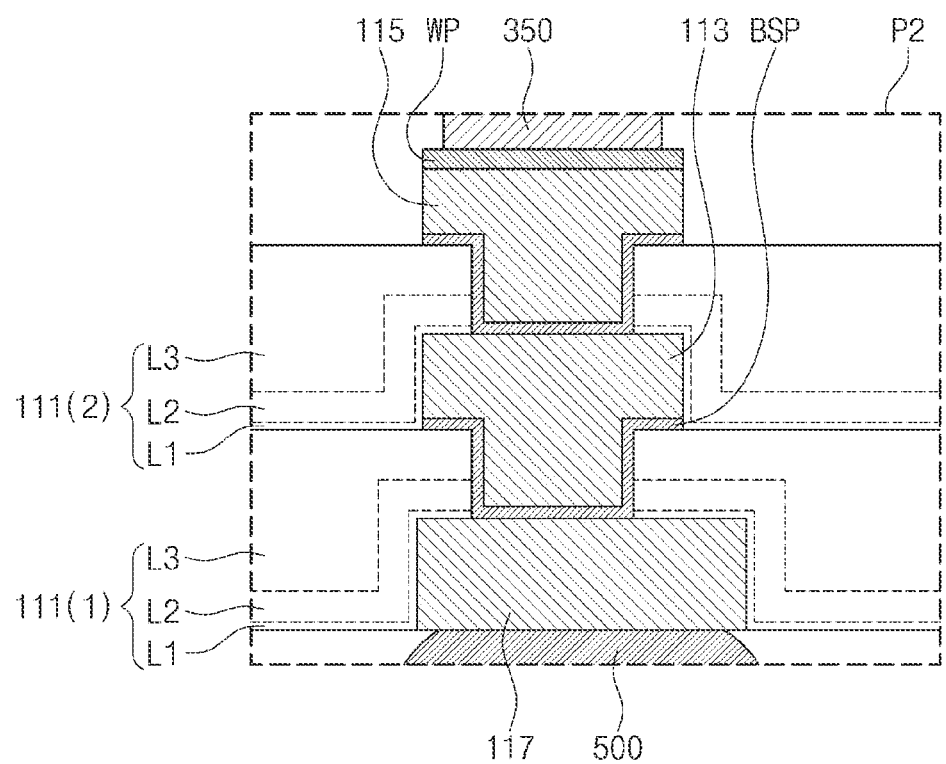
Figure 7C:
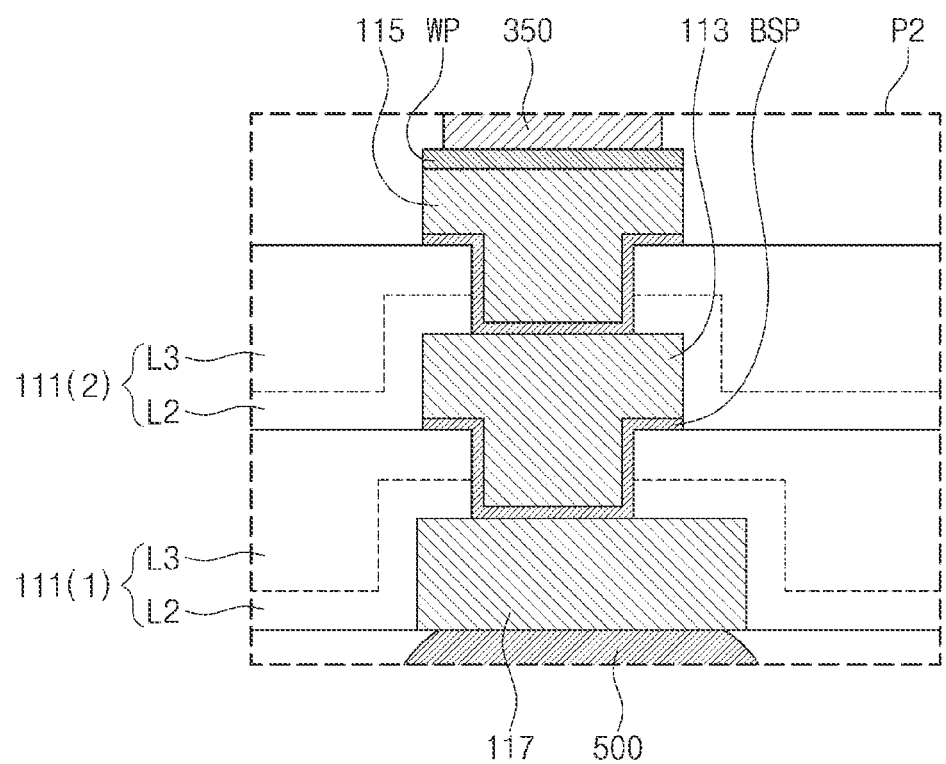

FIGS. 7A to 7C are enlarged views of a portion P2 of FIG. 6 according to some embodiments of the inventive concepts.

Referring to FIG. 7A, each of the first insulating layers 111 may include stacked layers L1 to L5 having different properties. Each of the first insulating layers 111 may include first to fifth sub-layers L1 to L5 stacked sequentially. The first to fifth sub-layers L1 to L5 may be the same as or similar to the first to fifth sub-layers L1 to L5 described with reference to FIG. 1C. The first to fifth sub-layers L1 to L5 of a lowermost first insulating layer 111(1) may conformally and sequentially cover the under bump pattern 117. The first redistribution pattern 113 may penetrate the first to fifth sub-layers L1 to L5 of the lowermost first insulating layer 111(1) so as to be connected to the under bump pattern 117. An uppermost first insulating layer 111(2) may include first to fifth sub-layers L1 to L5 stacked sequentially. The first to fifth sub-layers L1 to L5 of the uppermost first insulating layer 111(2) may conformally and sequentially cover the first redistribution pattern 113. The first redistribution pad 115 may penetrate the first to fifth sub-layers L1 to L5 of the uppermost first insulating layer 111(2) so as to be connected to the first redistribution pattern 113.

In the present embodiments, side surfaces of lower portions of the first redistribution pattern 113 and the first redistribution pad 115 may be substantially perpendicular to a top surface or a bottom surface of the first insulating layer 111. This may be because the precise patterns are realized by processes according to some embodiments of the inventive concepts, as described with reference to FIGS. 1A to 2C.

Referring to FIG. 7B, in some embodiments, each of the first insulating layers 111 may include first to third sub-layers L1 to L3 stacked sequentially. The first to third sub-layers L1 to L3 of each of the first insulating layers 111 according to the present embodiments may be the same as or similar to the first to third sub-layers L1 to L3 of FIG. 3B. In other words, the first sub-layer L1 may be the same as or similar to the first sub-layer L1 described with reference to FIGS. 1A to 2C. In other words, the first sub-layer L1 may include an amine compound and/or an amide compound and may function as an adhesion promoter layer. The first sub-layer L1 may exclude a photosensitizer. The first sub-layer L1 may have the first thickness T1, as illustrated in FIG. 2C. The second sub-layer L2 may be the same as or similar to the second sub-layer L2 described with reference to FIGS. 1A to 2C. The content of the photosensitizer included in the second sub-layer L2 may be higher than the content of the photosensitizer included in the third sub-layer L3. The refractive index of the second sub-layer L2 may be lower than the refractive index of the third sub-layer L3. The first binder resin included in the second sub-layer L2 may be different from the second binder resin included in the third sub-layer L3. For example, the molecular weight of the first binder resin may be less than the molecular weight of the second binder resin. Other components may be the same as or similar to corresponding components of FIG. 3B.

Referring to FIG. 7C, in some embodiments, each of the first insulating layers 111 may include the second and third sub-layers L2 and L3 stacked sequentially. Each of the first insulating layers 111 may exclude the first sub-layer L1 functioning as the adhesion promoter layer. Other components may be the same as or similar to those described with reference to FIG. 7B.

Each of the second insulating layers 121 of FIG. 6 may also be the same as or similar to each of the first insulating layers 111 described with reference to FIGS. 7A to 7C. Each of the first insulating layer 111 and the second insulating layer 121 may also be referred to as "a photosensitive insulating layer". Each of the first redistribution layer 110 and the second redistribution layer 120 may also be referred to as "a redistribution substrate".

FIGS. 8A to 8D are cross-sectional views illustrating a process of forming a first redistribution layer of FIG. 7A.

Figure 8A:
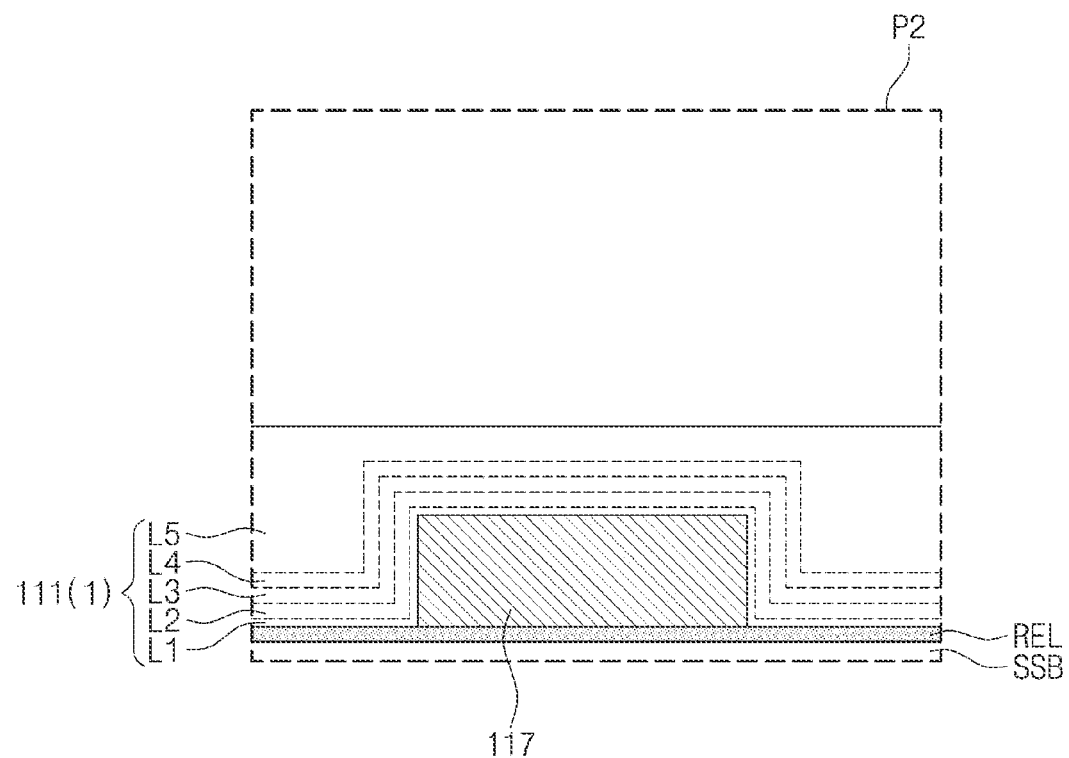
FIGS. 8A to 8D are cross-sectional views illustrating a process of forming a first redistribution layer of FIG. 7A.

Referring to FIG. 8A, a sacrificial layer REL may be stacked on a sacrificial substrate SSB. The sacrificial substrate SSB may be, for example, a transparent glass substrate or a bare wafer. The sacrificial layer REL may include, for example, an epoxy resin. The sacrificial layer REL may have, for example, a photolysis property or a thermolysis property. Under bump patterns 117 may be formed on the sacrificial layer REL. A lowermost first insulating layer 111(1) may be formed on the sacrificial layer REL. The lowermost first insulating layer 111(1) may be formed by sequentially coating first to fifth sub-layers L1 to L5. The first to fifth sub-layers L1 to L5 may be the same as or similar to the first to fifth sub-layers L1 to L5 described with reference to FIG. 1C.

Figure 8B:
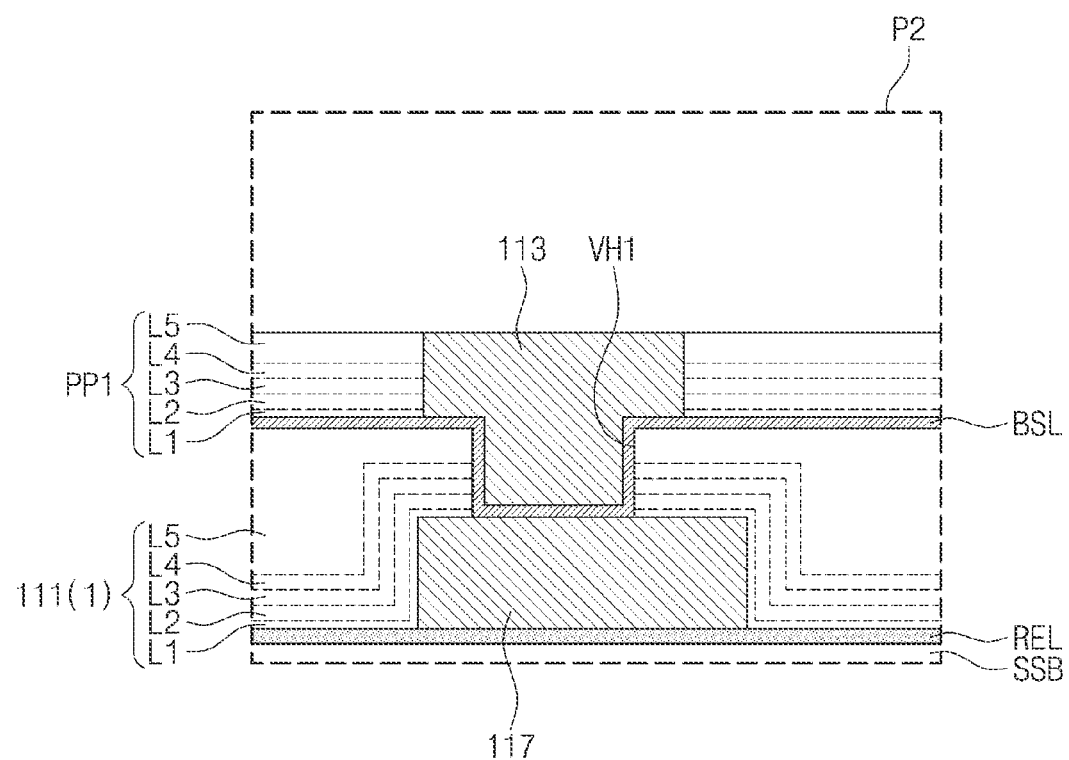

Referring to FIG. 8B, exposure and development processes may be performed on the lowermost first insulating layer 111(1) to form a first via hole VH1 exposing the under bump pattern 117. A barrier/seed layer BSL may be conformally stacked on the lowermost first insulating layer 111(1). A first photosensitive mask pattern PP1 may be formed on the barrier/seed layer BSL. A process of forming the first photosensitive mask pattern PP1 may be the same as or similar to that described with reference to FIG. 5B. A plating process may be performed to form a first redistribution pattern 113 which fills the first via hole VH1 and protrudes from the barrier/seed layer BSL.

Figure 8C:
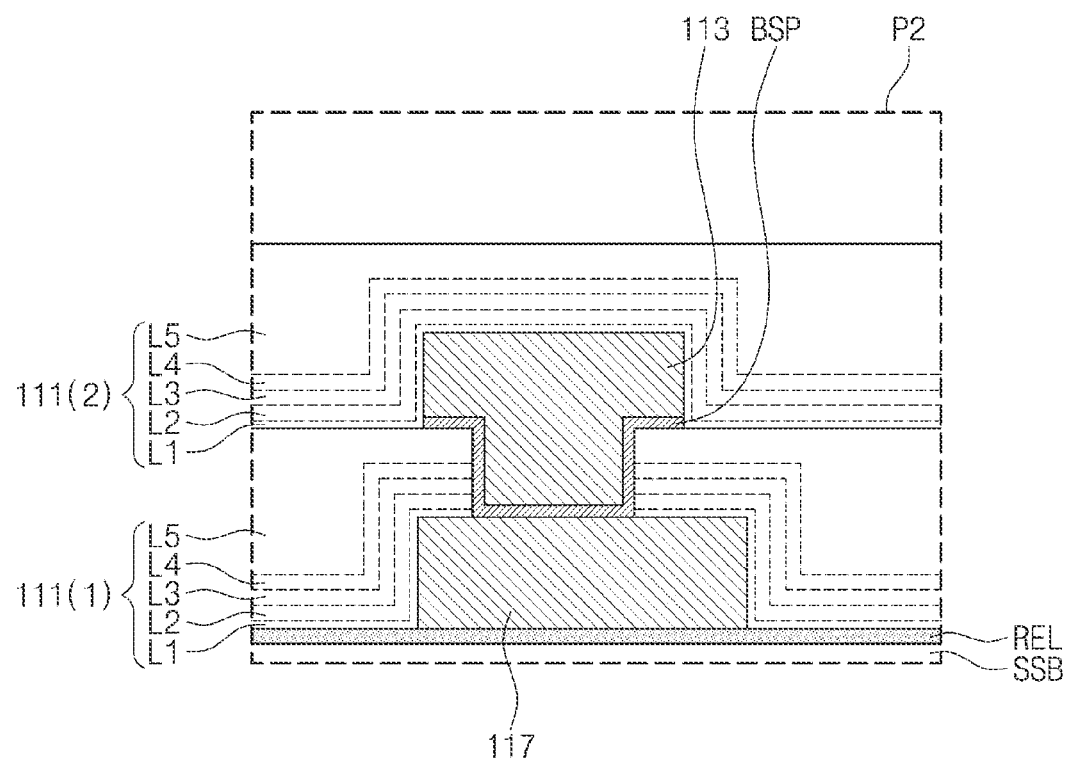

Referring to FIGS. 8B and 8C, the first photosensitive mask pattern PP1 may be removed, and the barrier/seed layer BSL exposed at sides of the first redistribution pattern 113 may be removed to form a barrier/seed pattern BSP. Next, an uppermost first insulating layer 111(2) may be formed on the first redistribution pattern 113 and the lowermost first insulating layer 111(1). The uppermost first insulating layer 111(2) may be formed by sequentially coating first to fifth sub-layers L1 to L5.

Figure 8D:
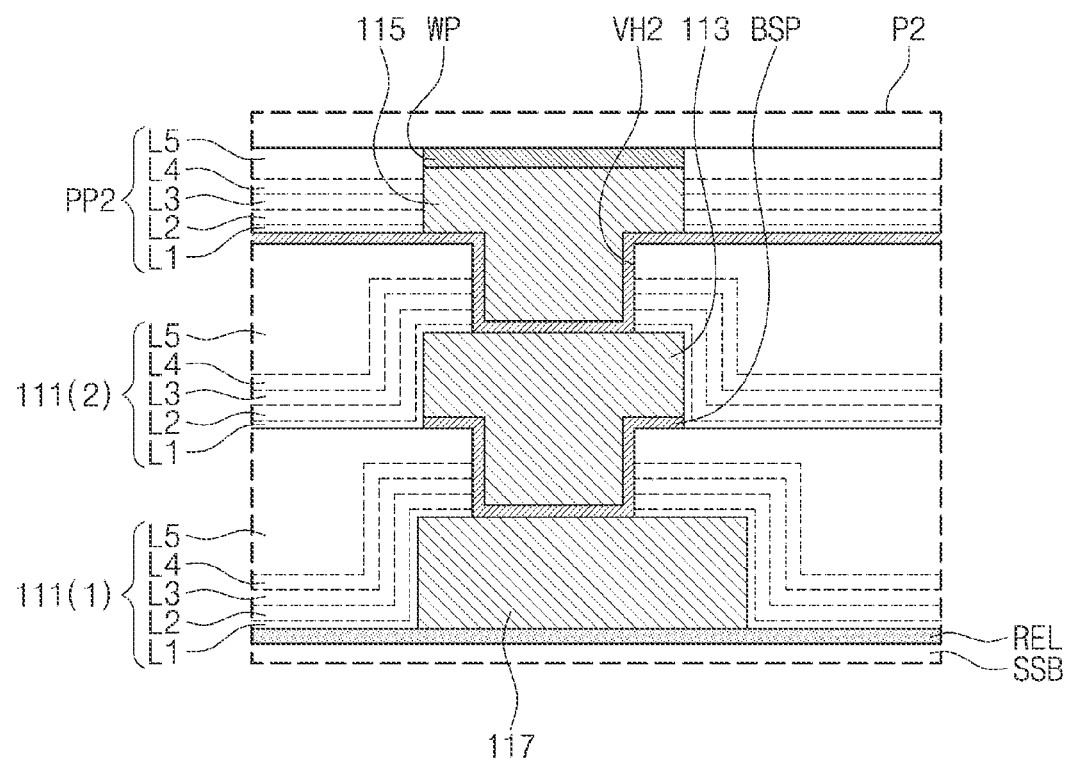

Referring to FIG. 8D, exposure and development processes may be performed on the uppermost first insulating layer 111(2) to form a second via hole VH2 exposing the first redistribution pattern 113. A barrier/seed layer BSL may be conformally stacked on the uppermost first insulating layer 111(2). A second photosensitive mask pattern PP2 may be formed on the barrier/seed layer BSL. A process of forming the second photosensitive mask pattern PP2 may be the same as or similar to the process of forming the first photosensitive mask pattern PP1 described with reference to FIG. 5B. Plating processes may be performed to sequentially form a first redistribution pad 115 filling the second via hole VH2 and protruding from the barrier/seed layer BSL, and a wetting layer WP. Referring again to FIG. 7A, the second photosensitive mask pattern PP2 may be removed. Thus, the first redistribution layer 110 may be formed. Even though not shown in the drawings, a process of forming the second redistribution layer 120 of FIG. 6 may be the same as or similar to the process of FIGS. 8A to 8D. The sacrificial layer REL and the sacrificial substrate SSB may be removed before bonding the external connection terminals 500.

The semiconductor package 1001 of FIG. 6 having the redistribution layers 110 and 120 manufactured by the method may have improved reliability and a high integration density.

The photosensitive insulating layer included in the printed circuit board or the semiconductor package according to example embodiments of the inventive concepts may include the stacked sub-layers having different properties. Thus, the adhesive strength between the photosensitive insulating layer and an underlying structure may be improved, and fine patterning may be realized. As a result, the reliability may be improved, and a high integration density may be realized.

In the method of manufacturing the printed circuit board or the semiconductor package according to example embodiments of the inventive concepts, the photosensitive mask layer or photosensitive insulating layer may include the stacked sub-layers having different properties, and thus adhesive strength between the photosensitive mask layer or photosensitive insulating layer and an underlying structure may be improved, and fine patterning may be realized. As a result, process failure may be reduced, and a yield may be improved.

While example embodiments of the inventive concepts have been particularly shown and described, it will be understood by one of ordinary skill in the art that variations in form and detail may be made therein without departing from the spirit and scope of the attached claims.

What is claimed is:

1. A printed circuit board comprising:
a substrate body portion;
conductive patterns on a top surface of the substrate body portion; and
a photosensitive insulating layer on the top surface of the substrate body portion and comprising an opening exposing a first one of the conductive patterns,
wherein the photosensitive insulating layer comprises a first sub-layer, a second sub-layer and a third sub-layer which are stacked sequentially on the top surface of the substrate body portion,
wherein the first sub-layer includes an amine compound or an amide compound,
wherein a refractive index of the second sub-layer is lower than a refractive index of the third sub-layer, and
wherein a photosensitizer content of the second sub-layer is higher than a photosensitizer content of the third sub-layer.

2. The printed circuit board of claim 1, wherein the photosensitive insulating layer further comprises a fourth sub-layer between the third sub-layer and the second sub-layer,
wherein a photosensitizer content of the fourth sub-layer is equal to the photosensitizer content of the second sub-layer, and
wherein the refractive index of the second sub-layer is lower than a refractive index of the fourth sub-layer.

3. The printed circuit board of claim 1, wherein the second sub-layer includes a first binder resin,
wherein the third sub-layer includes a second binder resin, and
wherein a molecular weight of the first binder resin is less than a molecular weight of the second binder resin.

4. The printed circuit board of claim 1, wherein the first sub-layer is devoid of photosensitizers of the second sub-layer and the third sub-layer.

5. The printed circuit board of claim 1, wherein the first sub-layer has a thickness in a range of 20 Å to 2000 Å.

6. The printed circuit board of claim 1, wherein the first, second and third sub-layers conformally cover a second one of the conductive patterns.

7. A semiconductor package comprising:
a first redistribution substrate;
a semiconductor device on the first redistribution substrate;
a mold layer on the semiconductor device and the first redistribution substrate;
a second redistribution substrate on the mold layer;
a signal via in the mold layer, the signal via connecting the first redistribution substrate and the second redistribution substrate and being configured to transmit an electrical signal;
a power via connecting the first redistribution substrate and the second redistribution substrate, the power via being configured to transmit a power voltage; and
connection terminals contacting a bottom surface of the first redistribution substrate,
wherein the first redistribution substrate comprises a first photosensitive insulating layer and a second photosensitive insulating layer which are stacked sequentially,
wherein the first photosensitive insulating layer comprises a first sub-layer, a second sub-layer and a third sub-layer which are stacked sequentially,
wherein the first sub-layer includes an amine compound or an amide compound,
wherein a refractive index of the second sub-layer is lower than a refractive index of the third sub-layer, and
wherein a photosensitizer content of the second sub-layer is higher than a photosensitizer content of the third sub-layer.

8. The semiconductor package of claim 7, wherein the first photosensitive insulating layer further comprises a fourth sub-layer between the third sub-layer and the second sub-layer,
wherein a photosensitizer content of the fourth sub-layer is equal to the photosensitizer content of the second sub-layer, and
wherein the refractive index of the second sub-layer is lower than a refractive index of the fourth sub-layer.

9. The semiconductor package of claim 7, wherein the second sub-layer includes a first binder resin,
wherein the third sub-layer includes a second binder resin, and
wherein a molecular weight of the first binder resin is less than a molecular weight of the second binder resin.

10. The semiconductor package of claim 7, wherein the first sub-layer is devoid of photosensitizers of the second sub-layer and the third sub-layer.

11. The semiconductor package of claim 7, wherein the first sub-layer has a thickness in a range of 20 Å to 2000 Å.

12. The semiconductor package of claim 7, wherein the first redistribution substrate further comprises a redistribution pattern in the first, second and third sub-layers.

13. The semiconductor package of claim 7, wherein the second photosensitive insulating layer comprises a fourth sub-layer, a fifth sub-layer and a sixth sub-layer which are stacked sequentially, and
wherein the fourth, fifth and sixth sub-layers of the second photosensitive insulating layer include the same materials as the first, second and third sub-layers of the first photosensitive insulating layer, respectively.

14. The semiconductor package of claim 7, wherein the second redistribution substrate comprises a plurality of third photosensitive insulating layers which are stacked sequentially,
wherein each of the third photosensitive insulating layers comprises a fourth sub-layer, a fifth sub-layer and a sixth sub-layer which are stacked sequentially, and wherein the fourth, fifth and sixth sub-layers of the third photosensitive insulating layers include the same materials as the first, second and third sub-layers of the first photosensitive insulating layer, respectively.

15. A semiconductor package comprising:
a substrate; and
a semiconductor device mounted on the substrate,
wherein the substrate comprises:
　a substrate body portion;
　conductive patterns on a top surface of the substrate body portion; and
　a photosensitive insulating layer on the top surface of the substrate body portion and comprising an opening exposing a first one of the conductive patterns,
wherein the photosensitive insulating layer comprises a first sub-layer, a second sub-layer, a third sub-layer and a fourth sub-layer which are stacked sequentially,
wherein the first sub-layer includes an amine compound or an amide compound,
wherein a refractive index of the second sub-layer is lower than refractive indexes of the third and fourth sub-layers, and
wherein a photosensitizer content of the third sub-layer is higher than a photosensitizer content of the fourth sub-layer.

16. The semiconductor package of claim 15, wherein the photosensitive insulating layer further comprises a fifth sub-layer on the fourth sub-layer, and
　wherein a photosensitizer content of the fifth sub-layer is lower than the photosensitizer content of the fourth sub-layer.

17. The semiconductor package of claim 15, wherein the second sub-layer includes a photosensitizer, and
　wherein a photosensitizer content of the second sub-layer is equal to the photosensitizer content of the third sub-layer.

18. The semiconductor package of claim 15, wherein the second sub-layer includes a first binder resin,
　wherein each of the third and fourth sub-layers includes a second binder resin, and
　wherein a molecular weight of the first binder resin is less than a molecular weight of the second binder resin.

19. The semiconductor package of claim 15, wherein the first sub-layer is devoid of photosensitizers of the third sub-layer and the fourth sub-layer.

20. The semiconductor package of claim 15, wherein the first to fourth sub-layers conformally cover a second one of the conductive patterns.

* * * * *